(12) United States Patent
Liu et al.

(10) Patent No.: US 11,424,255 B2
(45) Date of Patent: Aug. 23, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Ming-Chyi Liu, Hsinchu (TW); Chih-Ren Hsieh, Changhua County (TW); Sheng-Chieh Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 240 days.

(21) Appl. No.: 16/787,952

(22) Filed: Feb. 11, 2020

(65) Prior Publication Data
US 2021/0249429 A1   Aug. 12, 2021

(51) Int. Cl.
| | |
|---|---|
| H01L 29/66 | (2006.01) |
| H01L 27/11521 | (2017.01) |
| H01L 21/28 | (2006.01) |
| H01L 21/762 | (2006.01) |
| H01L 21/311 | (2006.01) |
| H01L 29/423 | (2006.01) |
| H01L 21/3213 | (2006.01) |
| H01L 21/3105 | (2006.01) |
| H01L 29/788 | (2006.01) |

(52) U.S. Cl.
CPC .. *H01L 27/11521* (2013.01); *H01L 21/31053* (2013.01); *H01L 21/31116* (2013.01); *H01L 21/31144* (2013.01); *H01L 21/32135* (2013.01); *H01L 21/32139* (2013.01); *H01L 21/76224* (2013.01); *H01L 29/40114* (2019.08); *H01L 29/42324* (2013.01); *H01L 29/66825* (2013.01); *H01L 29/7883* (2013.01)

(58) Field of Classification Search
CPC ......... H01L 21/76224; H01L 27/11546; H01L 29/40114; H01L 27/11521; H01L 29/40117; H01L 29/42328; H01L 29/42344; H01L 29/66545; H01L 29/66825
See application file for complete search history.

(56) References Cited

U.S. PATENT DOCUMENTS

| | | | |
|---|---|---|---|
| 6,509,232 B1 * | 1/2003 | Kim | H01L 27/11526 438/257 |
| 10,879,253 B2 * | 12/2020 | Wu | H01L 27/11531 |

* cited by examiner

*Primary Examiner* — Jaehwan Oh
(74) *Attorney, Agent, or Firm* — Maschoff Brennan

(57) ABSTRACT

A semiconductor device includes a substrate, an isolation feature, a floating gate, and a control gate. The substrate has a protruding portion. The isolation feature surrounds the protruding portion of the substrate. The floating gate is over the protruding portion of the substrate, in which a sidewall of the floating gate is aligned with a sidewall of the protruding portion of the substrate. The control gate is over the floating gate.

20 Claims, 56 Drawing Sheets

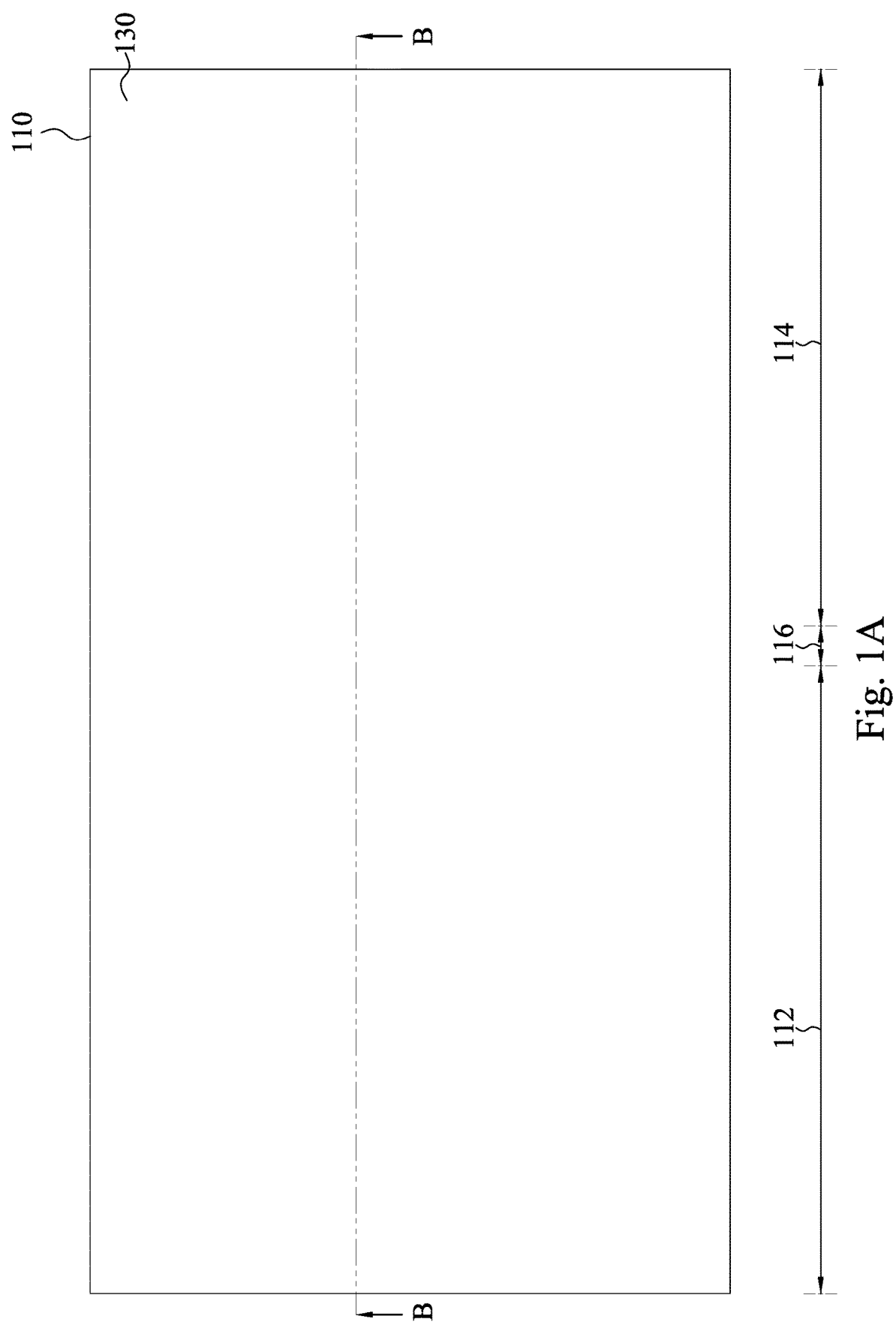

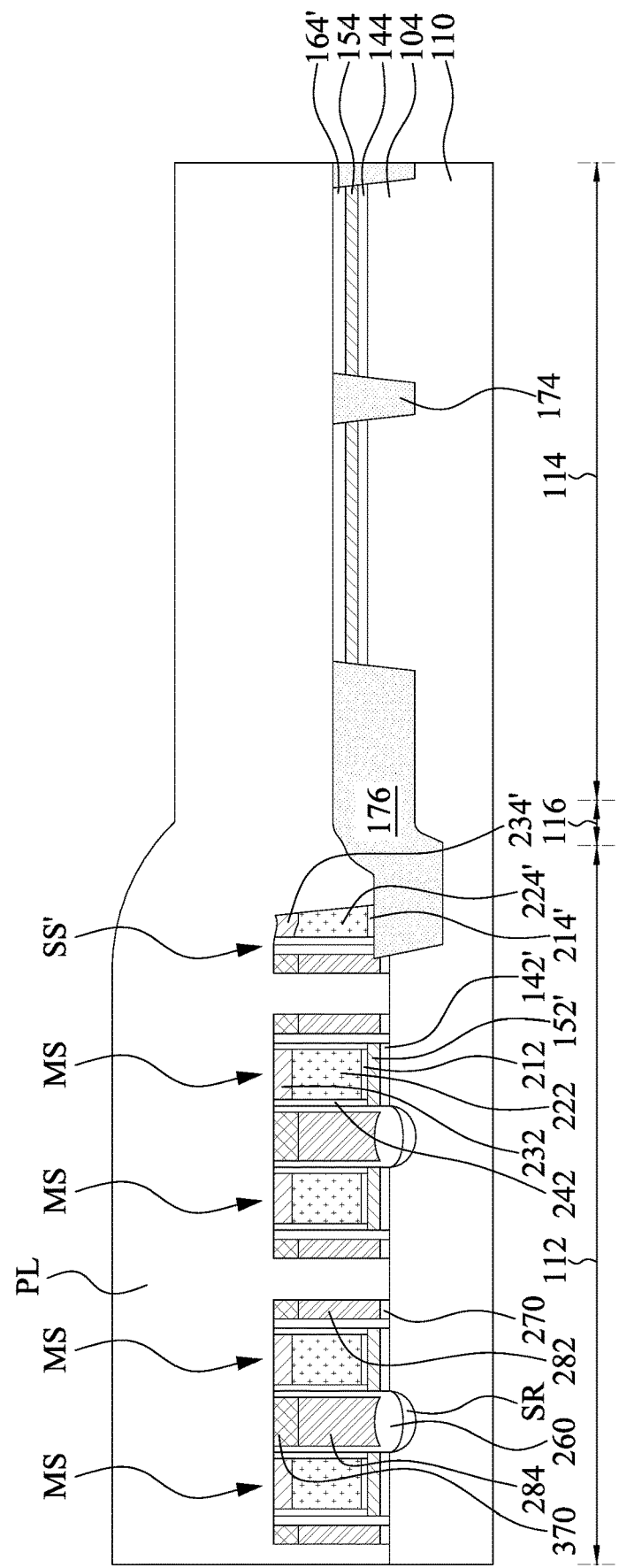

ced on the page. It is noted that, in accordance with the standard practice in the industry, various features are not drawn to scale. In fact, the dimensions of the various features may be arbitrarily increased or reduced for clarity of discussion.

SEMICONDUCTOR DEVICE AND MANUFACTURING METHOD THEREOF

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the polysilicon gate electrode with a metal gate electrode to improve device performance with the decreased feature sizes.

Super-flash technology has enabled designers to create cost effective and high performance programmable SOC (system on chip) solutions through the use of split-gate flash memory cells. The aggressive scaling of the third generation embedded super-flash memory (ESF3) enables designing flash memories with high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
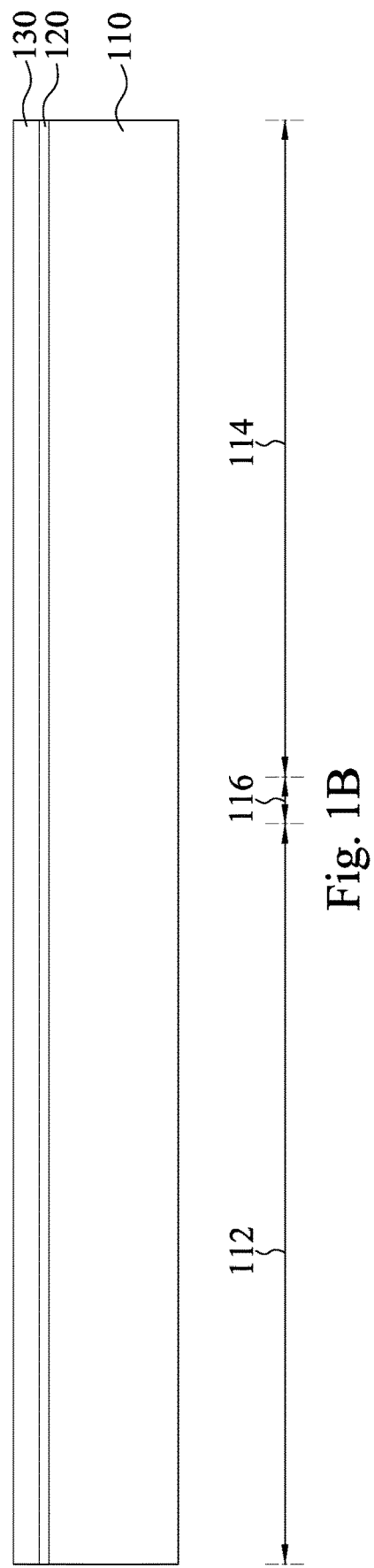
FIGS. 1A to 22 illustrate a method for manufacturing a semiconductor device including an integrated circuit at different stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Flash memory can be formed on a bulk silicon substrate and uses various bias conditions to read and write data values. For example, an EFS3 cell—or so-called "third generation SUPERFLASH" cell—includes a pair of symmetric split gate memory cells, each of which includes a pair of source/drain regions with a channel region arranged there between. In the EFS3 architecture, one of the source/drain regions for each of the split gate memory cells is a common source/drain region shared with its neighboring cell, while the other source/drain region is an individual source/drain unique to the cell. Within each split gate cell, a floating gate is arranged over the channel region of the cell, and a control gate is arranged over the floating gate. A select gate is arranged on one side of the floating and control gates (e.g., between an individual source/drain region of the EFS3 cell and a sidewall of the floating and/or control gate). At least one cell is configured to store a variable charge level on its floating gate, wherein the level of this charge corresponds to a data state stored in the cell and is stored in a non-volatile manner so that the stored charge/data persists in the absence of power.

By changing the amount of charge stored on the floating gate, the threshold voltage $V_{th}$ of the memory cell device can be correspondingly changed. For example, to perform a program operation (e.g., write a logical "0", program is 0, Vt high) for a cell, the control gate is biased with a high (e.g., at least an order of magnitude higher) voltage relative a voltage applied across the channel region and/or relative to a voltage applied to the select gate. The high bias voltage promotes Fowler-Nordheim tunneling of carriers from the channel region towards the control gate. As the carriers tunnel towards the control gate, the carriers become trapped in the floating gate and alter the $V_{th}$ of the cell. Conversely, to perform an erase operation (e.g., write a logical "1", erase is 1, Vt low) for the cell, the erase gate is biased with a high (e.g., at least an order of magnitude higher) voltage relative a voltage applied across the channel region and/or relative to a voltage applied to the control gate. The high bias voltage promotes Fowler-Nordheim tunneling of carriers from the floating gate towards the erase gate, thereby removing carriers from the floating gate and again changing the $V_{th}$ of the cell in a predictable manner. Subsequently, during a read operation, a voltage is applied to the select gate to induce part of the channel region to conduct. Application of a voltage to the select gate attracts carriers to part of the channel region adjacent to the select gate. While the select gate voltage is applied, a voltage greater than $V_{th}$, but less than $V_{th}+\Delta V_{th}$, is applied to the control gate (where $\Delta V_{th}$, is a change in $V_{th}$ due to charge trapped on the floating gate). If the memory cell device turns on (i.e., allows charge to flow), then it is deemed to contain a first data state (e.g., a logical "1" is read). If the memory cell device does not turn on, then it is deemed to contain a second data state (e.g., a logical "0" is read).

Due to the high-voltages involved in performing program and/or erase operations, high energy implants are used in some instances to form the source/drain regions of the flash memory cells. Thus, the source/drain regions of the flash cells can be implanted deeper than that of low-voltage CMOS devices. This additional implant depth can help to reduce current crowding at the substrate surface near edges of the source/drain regions.

Some embodiments of the present disclosure relate to flash memory devices that are formed on a recessed region of a substrate. Although some implementations are illustrated below with regards to split gate flash memory, it will be appreciated that this concept is not limited to split gate flash memory cells, but is also applicable to other types of flash memory cells as well as to other types of semiconductor devices, such as MOSFETs, FinFETs, and the like.

FIGS. 1A to 22 illustrate a method for manufacturing a semiconductor device including an integrated circuit at different stages in accordance with some embodiments. Reference is made to FIGS. 1A and 1B, where FIG. 1A is a top view of the IC according with some embodiments, and FIG. 1B is a cross-sectional view taken along line B-B of FIG. 1A. A substrate 110 is provided. In some embodiments, the substrate 110 can be a semiconductor substrate, such as a bulk silicon substrate, a germanium substrate, a compound semiconductor substrate, or other suitable substrate. The substrate 110 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 110 includes a cell region 112, a peripheral region 114, and a transition region 116. The peripheral region 114 is located at at least one edge of the cell region 112. For example, the peripheral region 114 surrounds the cell region 112. The transition region 116 is disposed between the cell region 112 and the peripheral region 114. A pad layer 120 is formed over the substrate 110. The pad layer 120 may be formed of a dielectric material, such as an oxide layer. A mask layer 130 is formed over the pad layer 120. In some embodiments, the mask layer 130 is formed of dielectric material, such as silicon nitride (SiN) or other suitable materials. In some embodiments, the thickness of the mask layer 130 is few hundred angstroms, such as about 200 angstroms to about 2000 angstroms, and the thickness of the pad layer 120 is about 30 angstroms to about 300 angstroms, and the present disclosure is not limited in this respect.

Figure 2:
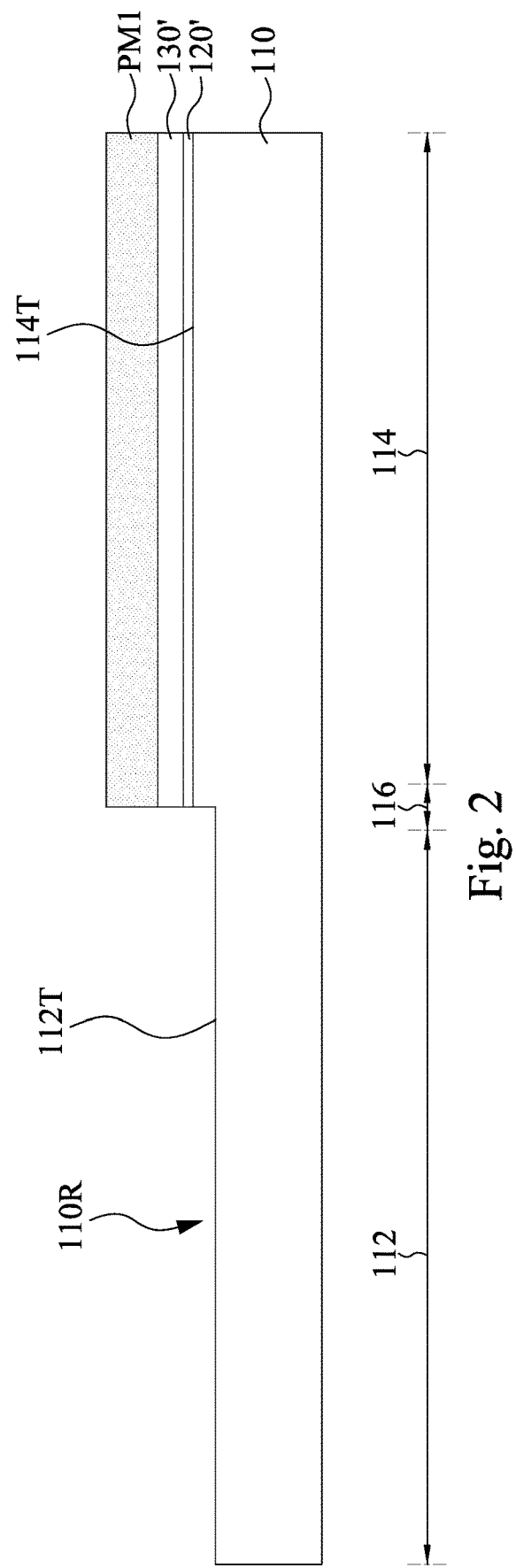

Reference is made to FIG. 2, where the cross-sectional position of FIG. 2 is the same as the cross-sectional position of FIG. 1B. A photomask PM1 (e.g., photoresist) is formed over the mask layer 130 (referring to FIG. 1B) and patterned by suitable lithography process. Through the patterned photomask PM1, the pad layer 120 and the mask layer 130 (referring to FIG. 1B) are patterned by suitable etching process to respectively form a patterned pad layer 120' and a patterned mask layer 130' over the peripheral region 114 of the substrate 110. Specifically, portions of the pad layer 120 and the mask layer 130 (referring to FIG. 1B) above the cell region 112 of the substrate 110 are removed to expose the cell region 112 of the substrate 110, which is then recessed (such as etched) through the patterned pad layer 120', the patterned mask layer 130', and the patterned photomask PM1. Therefore, a recess 110R is formed in the cell region 112 of the substrate 110. For example, a top surface 112T of the cell region 112 is lower than a top surface 114T of the peripheral region 114. In some embodiments, the depth of the recess 110R is about 50 angstroms to about 2000 angstroms.

Figure 3:
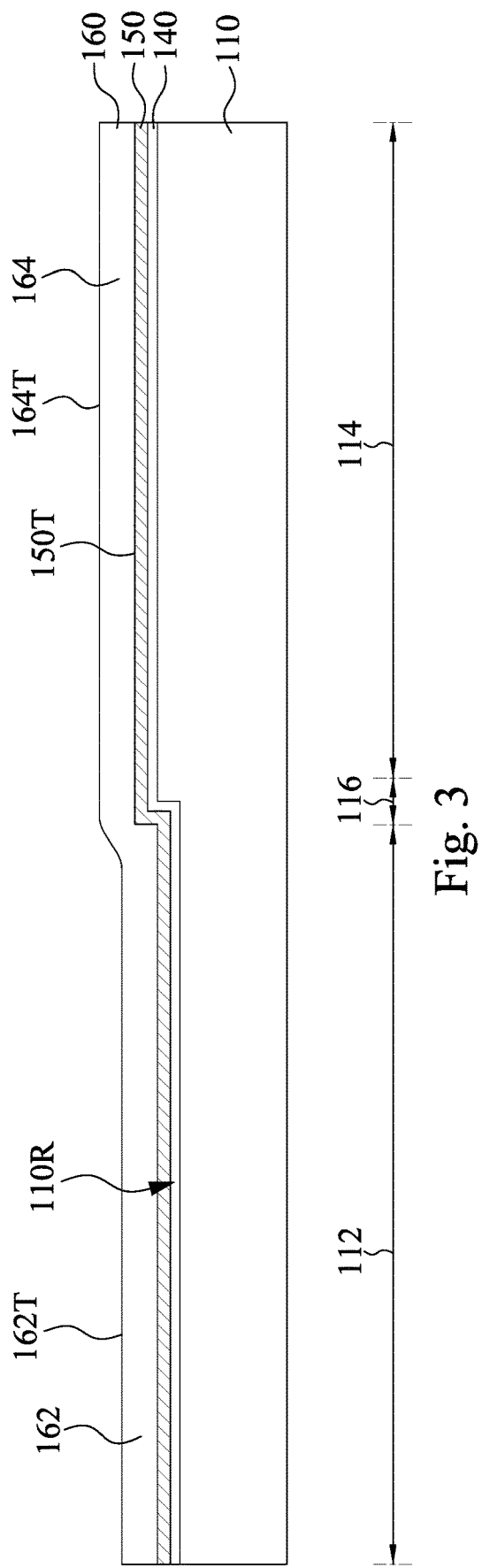

Reference is made to FIG. 3, where the cross-sectional position of FIG. 3 is the same as the cross-sectional position of FIG. 2. The patterned pad layer 120' and the patterned mask layer 130' (referring to FIG. 2) are removed. As such, the peripheral region 114 and the transition region 116 of the substrate 110 are exposed. A tunneling film 140 is then conformally formed over the substrate 110. In some embodiments, the tunneling film 140 may include, for example, a dielectric material such as silicon dioxide ($SiO_2$), silicon nitride ($Si_3N_4$), oxynitrides (SiON), high-k materials, other non-conductive materials, or combinations thereof. The tunneling film 140 may be formed using thermal oxide, chemical vapor deposition (CVD), physical vapor deposition (PVD), atomic layer deposition (ALD), ozone oxidation, other suitable processes, or combinations thereof.

A floating gate film 150 is conformally formed over the tunneling film 140. The floating gate film 150 may include polysilicon formed through, for example low pressure CVD (LPCVD) methods, CVD methods and PVD sputtering methods employing suitable silicon source materials. If desired, the floating gate film 150 may be ion implanted to the desired conductive type. It is to be appreciated other gate electrode material such as metal, metal alloys, single crystalline silicon, or combinations thereof.

A mask layer 160 is conformally formed over the floating gate film 150. The mask layer 160 can be formed of dielectric material, such as silicon nitride (SiN) or other suitable materials. Due to the presence of the recess 110R in the cell region 112 of the substrate 110, a top surface 164T of a portion 164 of the mask layer 160 in the peripheral region 114 is higher than a top surface 162T of another portion 162 of the mask layer 160 in the cell region 112 of the substrate 110. In some embodiments, the top surface 162T of the portion 162 of the mask layer 160 in the cell region 112 is higher than a top surface 150T of the floating gate film 150.

Figure 4:
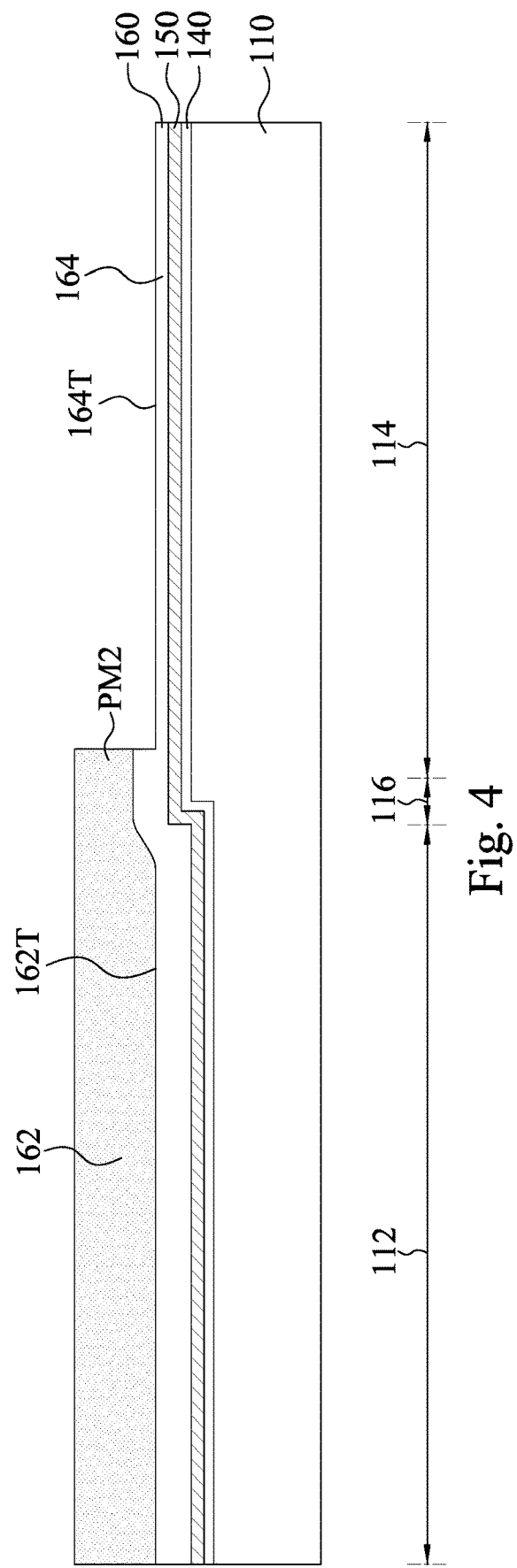

Reference is made to FIG. 4, where the cross-sectional position of FIG. 4 is the same as the cross-sectional position of FIG. 3. The portion 164 of the mask layer 160 in the peripheral region 114 is thinned by suitable etching process. Specifically, a photomask PM2 (e.g., photoresist) is formed over the mask layer 160 and patterned by suitable lithography process, and a portion of the mask layer 160 exposed by the patterned photomask PM2 is then etched by suitable etching process, thereby lowering the top surface 164T of the portion 164 of the mask layer 160. In some embodiments, the lowered top surface 164T of the portion 164 may be substantially level with the top surface 162T of the portion 162 of the mask layer 160. After thinning the portion 164 of the mask layer 160, the photomask PM2 may be removed by suitable solvent stripping or plasma ashing process.

Figure 5A:
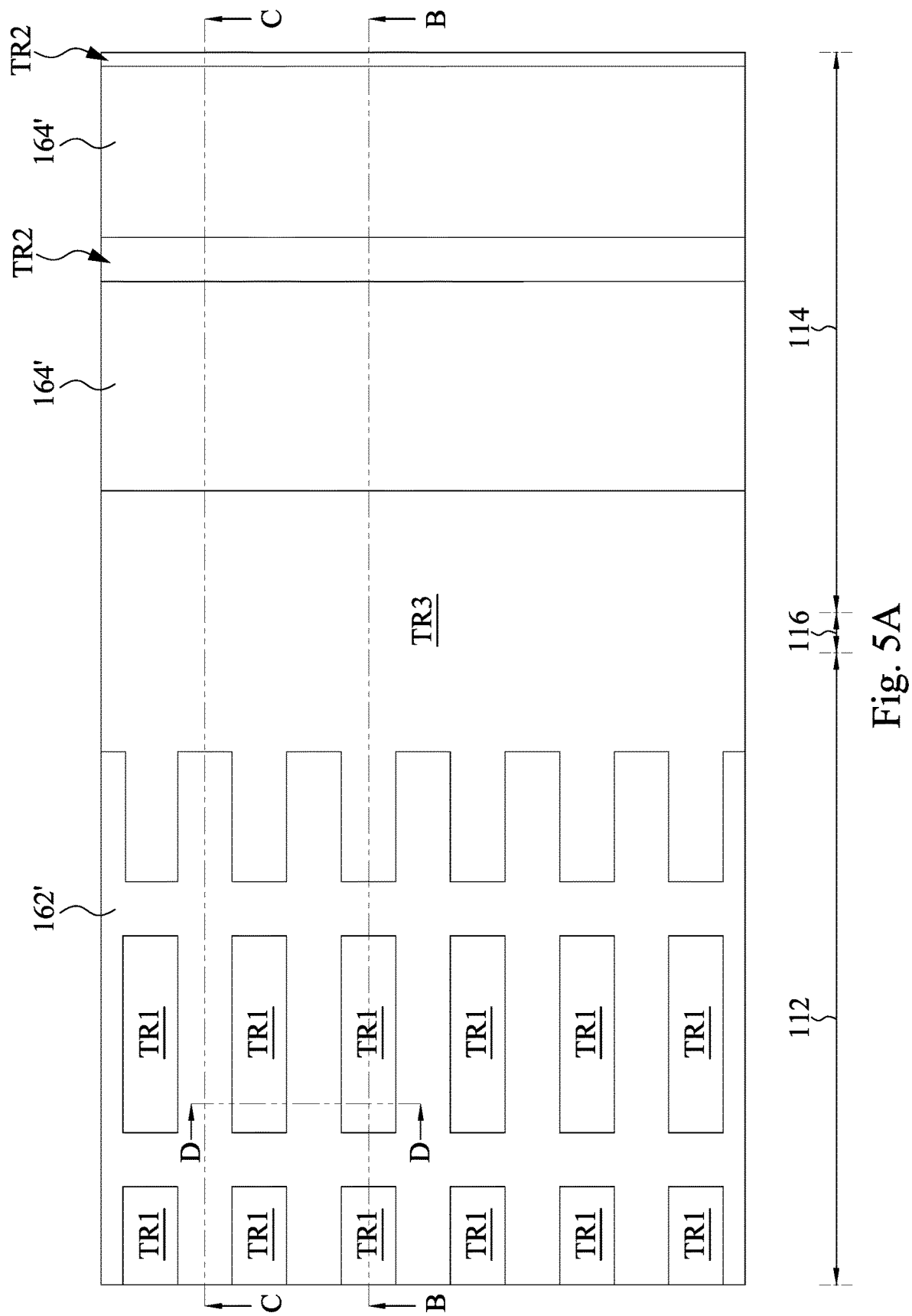
Figure 5B:
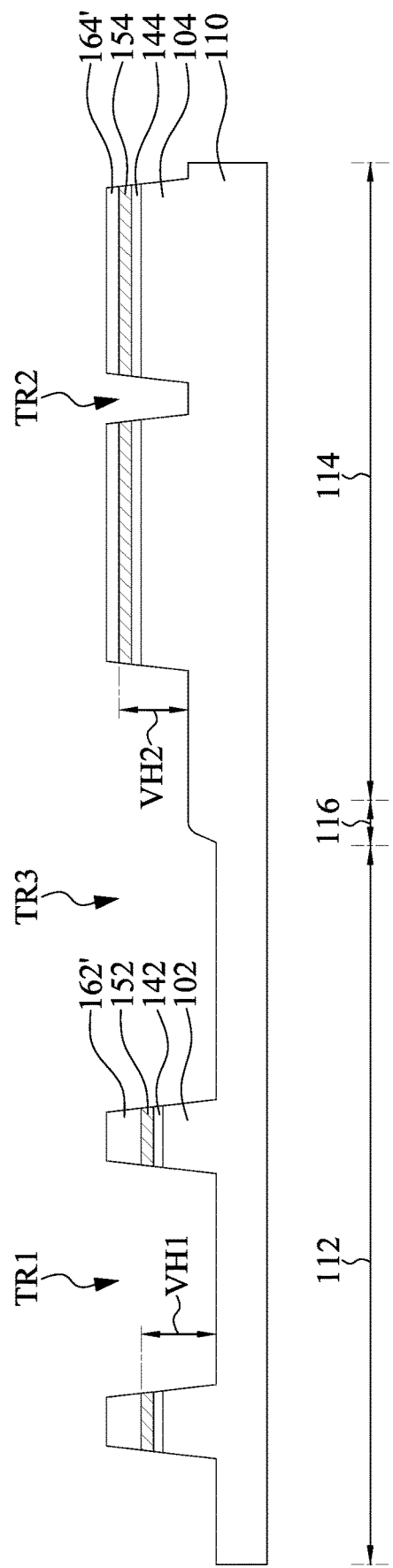
Figure 5C:
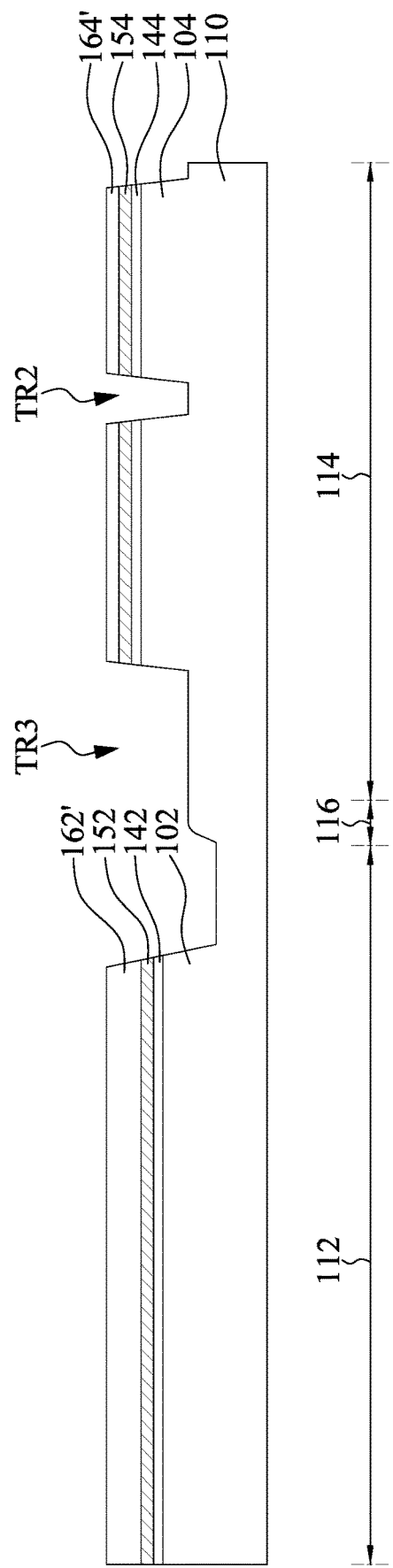
Figure 5D:
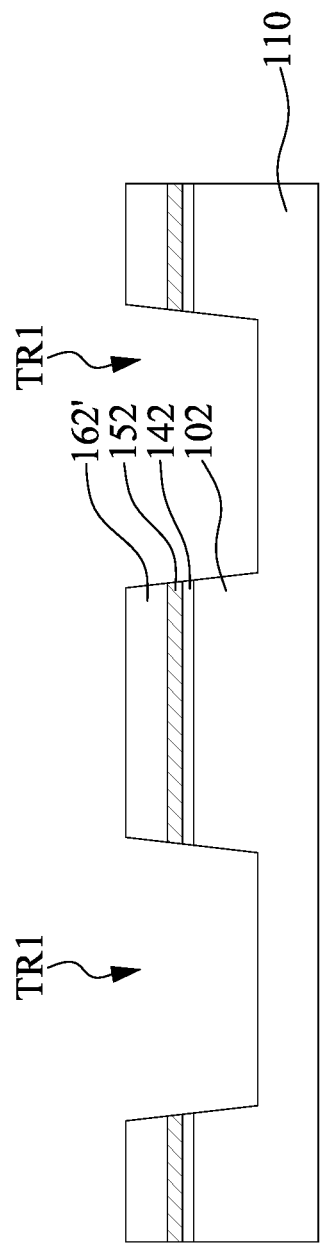

Reference is made to FIGS. 5A to 5D, where FIG. 5A is a top view of the IC, FIG. 5B is a cross-sectional view taken along line B-B of FIG. 5A, FIG. 5C is a cross-sectional view taken along line C-C of FIG. 5A, and FIG. 5D is a cross-sectional view taken along line D-D of FIG. 5A. The structure of FIG. 4 is patterned to form a plurality of trenches TR1, TR2, and TR3. The trenches TR1 are formed in the cell region 112, the trenches TR2 are formed in the peripheral region 114, and the trench TR3 is formed in the transition region 116. Specifically, the trenches TR1, TR2, and TR3 are formed by forming a patterned photomask (e.g., photoresist) over the mask layer 160 (referring to FIG. 4), the patterned photomask covering some portions of the mask layer 160 (referring to FIG. 4) while leaving other regions of the mask layer 160 (referring to FIG. 4) exposed and performing an etch process to remove the exposed portions of the mask layer 160 (referring to FIG. 4) and the corresponding layers underneath (i.e., the mask layer 160, the floating gate film 150, the tunneling film 140, and the substrate 110).

The etch process may include first and second dry etch process. The first dry etch process is performed to remove the exposed portions of the mask layer 160 (referring to FIG. 4), thereby patterning the mask layer 160 (referring to FIG. 4) into the mask layers 162' and 164' in the cell region 112 and the peripheral region 114, respectively. In some embodiments, the first dry etch process may use gas etchants such as $H_3PO_4$, HF, the combination thereof, or the like. The floating gate film 150 (referring to FIG. 4) may have a higher etch resistance to the first dry etch process than that of the mask layer 160 (referring to FIG. 4), and serve as an etch stop layer for the first dry etch process. The second dry etch process is performed to remove the floating gate film 150 (referring to FIG. 4), the tunneling film 140 (referring to FIG. 4), and the substrate 110 exposed by the mask layers 162' and 164', thereby patterning the floating gate film 150 (referring to FIG. 4), the tunneling film 140 (referring to FIG. 4), and the substrate 110. In some embodiments, the second dry etch process may use gas etchants such as $CF_4$, Ar, $NF_3$, $Cl_2$, He, HBr, $O_2$, $N_2$, $CH_3F$, $CH_4$, $CH_2F_2$, the combination thereof, or the like. The floating gate film 150 (referring to FIG. 4) is patterned into the floating gate layers 152 and 154 in the cell region 112 and the peripheral region 114, respectively. The tunneling film 140 (referring to FIG. 4) is patterned into the tunneling layers 142 and 144 in the cell region 112 and the peripheral region 114, respectively. The substrate 110 is patterned to form base portions 102 and 104 in the cell region 112 and the peripheral region 114, respectively.

Moreover, since the mask layer 160 (referring to FIG. 4) have different thicknesses over the cell region 112 and the peripheral region 114, the first dry etch process removes different amounts of the mask layer 160 (referring to FIG. 4) in the cell region 112 and the peripheral region 114, such that the formed trenches TR1 and TR2 may have different depths. For example, the trenches TR1 are deeper than the trenches TR2. In some embodiments, the second dry etch process may remove similar amounts of the floating gate film 150, the tunneling film 140, and the substrate 110 (referring to FIG. 4), such that a vertical height difference VH1 between the top surface of the floating gate layer 152 and a bottom of the trench TR1 may be substantially equal to a vertical height difference VH2 between the top surface of the floating gate layer 154 and a bottom of the trench TR2. In some embodiments, due to the trench sizes difference, the second dry etch process may remove different amounts of the floating gate film 150, the tunneling film 140, and the substrate 110 (referring to FIG. 4) in the cell region 112 and the peripheral region 114, which will result in that the trenches TR1 and TR2 are etched by different etching rate. For example, in the present embodiments, the trenches TR1 have a greater opening than that of the trench TR2, such that the trenches TR1 are etched faster than the trenches TR2, which in turn will result in that the vertical height difference VH1 is greater than the vertical height difference VH2.

Figure 6A:
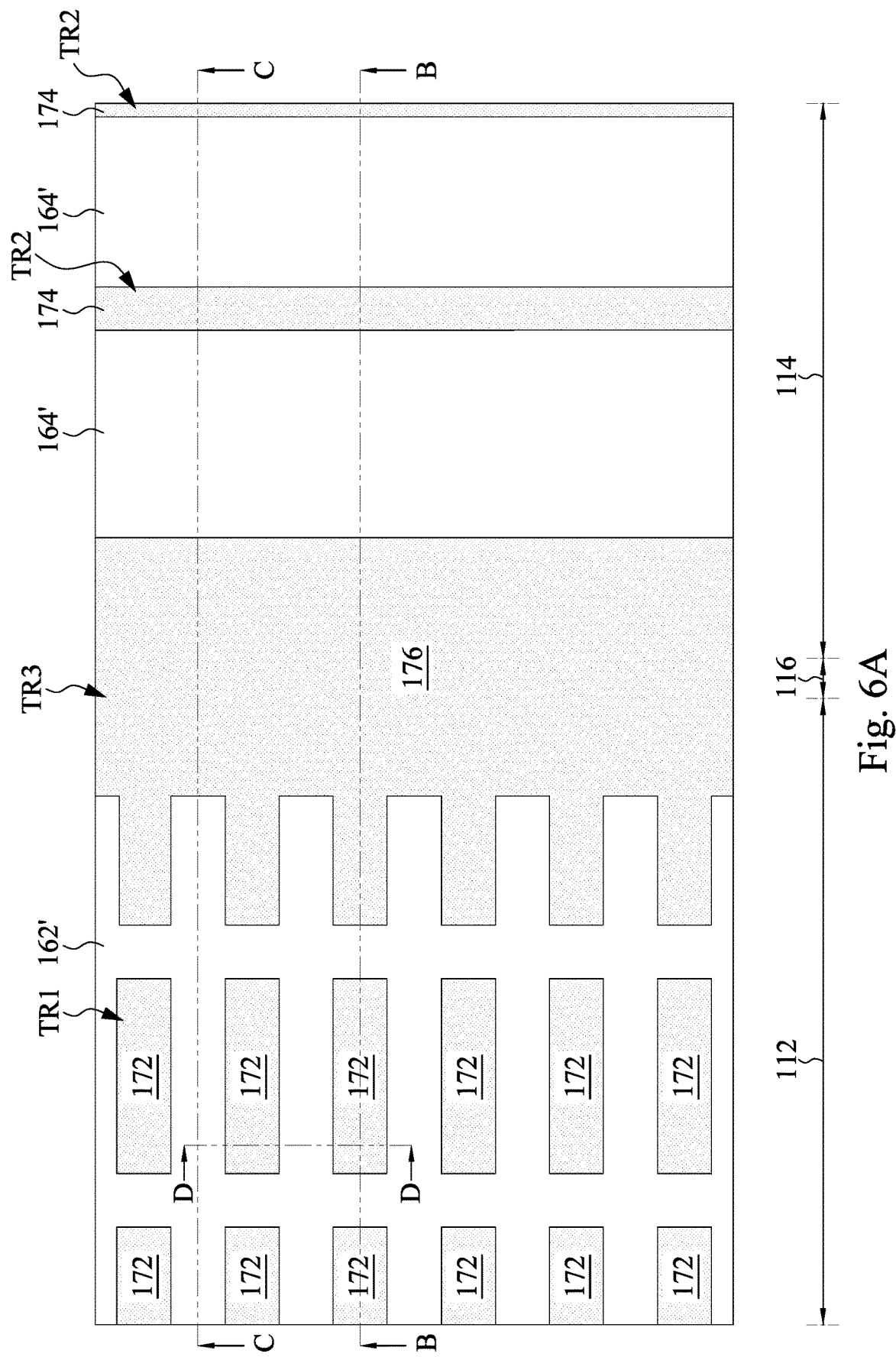
Figure 6B:
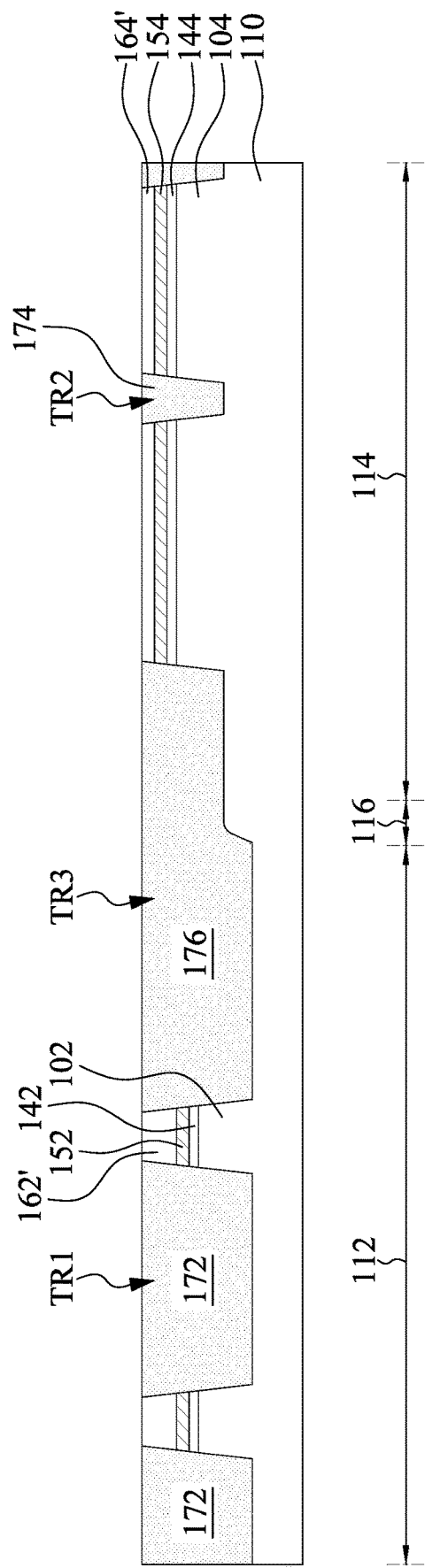
Figure 6C:
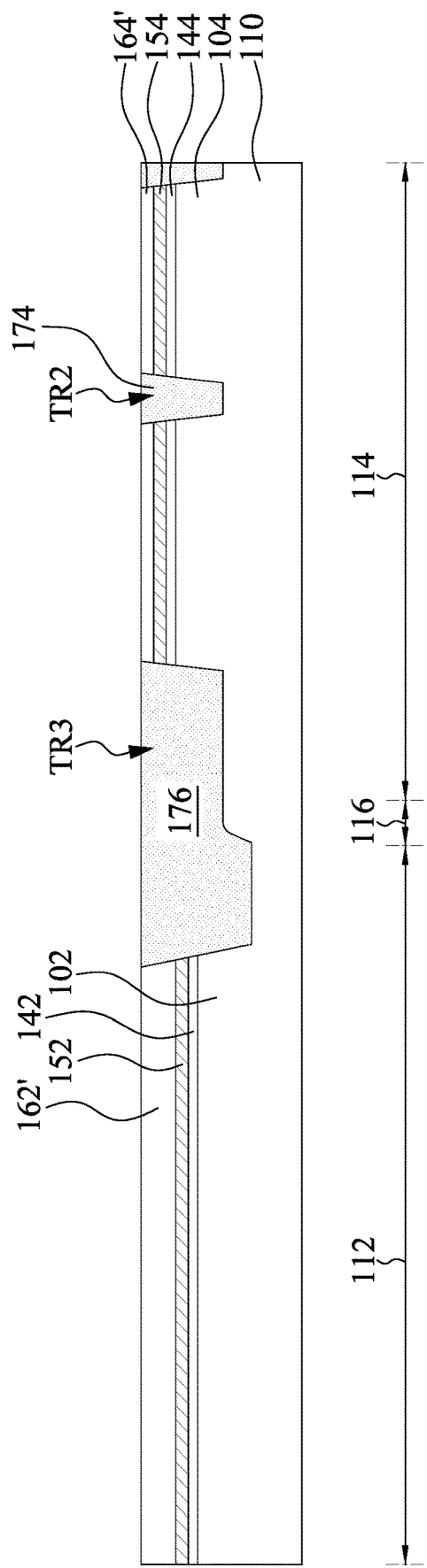
Figure 6D:
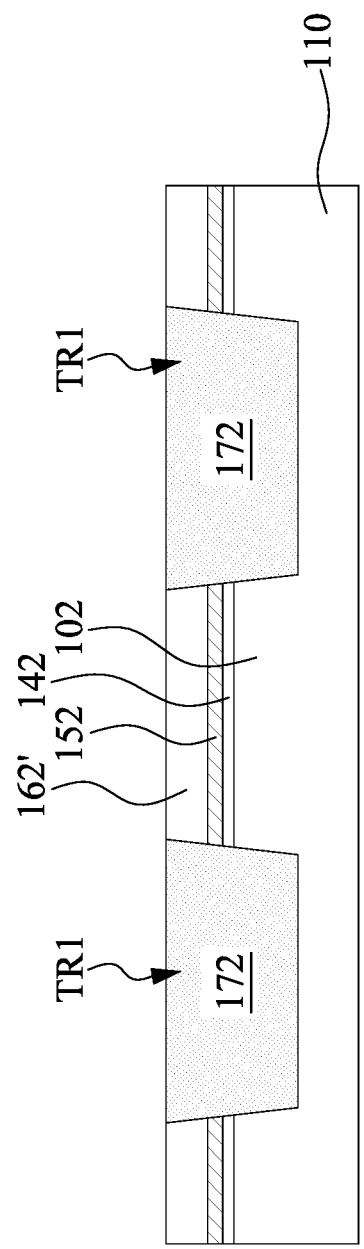

Reference is made to FIGS. 6A to 6D, where FIG. 6A is a top view of the IC, FIG. 6B is a cross-sectional view taken along line B-B of FIG. 6A, FIG. 6C is a cross-sectional view taken along line C-C of FIG. 6A, and FIG. 6D is a cross-sectional view taken along line D-D of FIG. 6A. Isolation features 172, 174, and 176 are respectively formed in the trenches TR1, TR2, and TR3. In greater detail, dielectric material covers the structure of FIGS. 5A-5D. In some embodiments, the dielectric material includes oxide and/or other dielectric materials. Optionally, a liner oxide (not shown) may be formed in advance. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other commonly used CVD methods. The formation of the liner oxide reduces the electrical fields and hence improves the performance of the resulting semiconductor device. A chemical mechanical polish (CMP) is then performed to level the top surface of the dielectric material to the top surfaces of the mask layers 162' and 164' to form the isolation features 172, 174, and 176 in the trenches TR1, TR2, and TR3, respectively. In some other embodiments, the top surfaces of the isolation features 172, 174, and 176 may be slightly lower than the top surfaces of the mask layers 162' and 164' due to CMP loading effects.

Figure 7A:
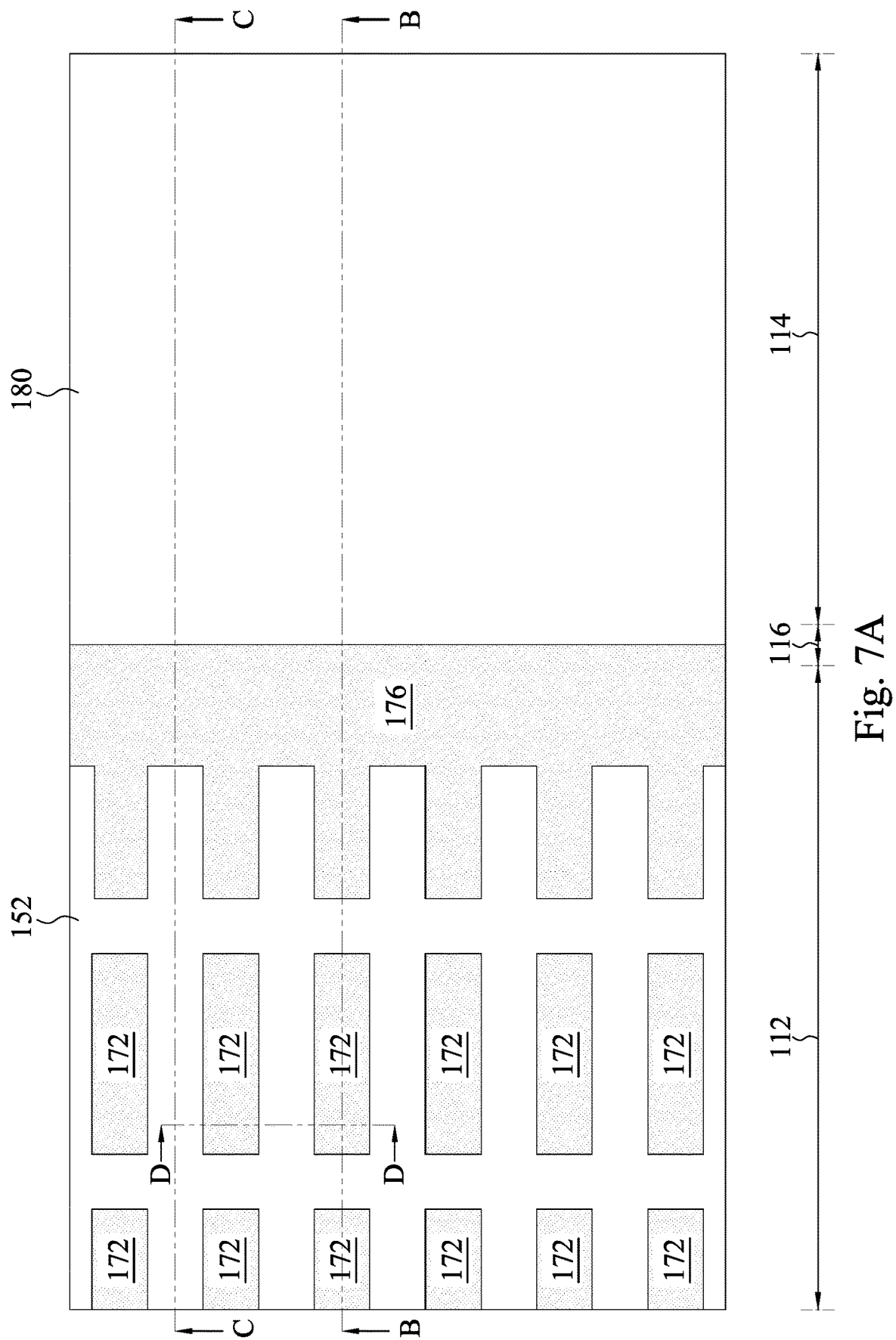
Figure 7B:
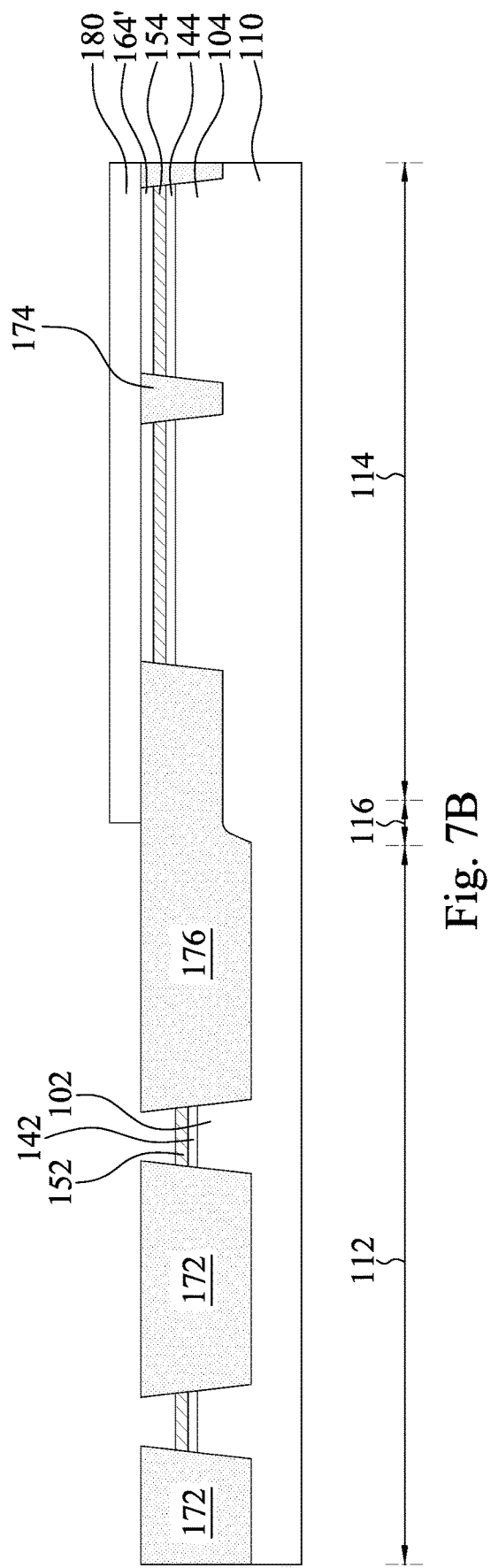
Figure 7C:
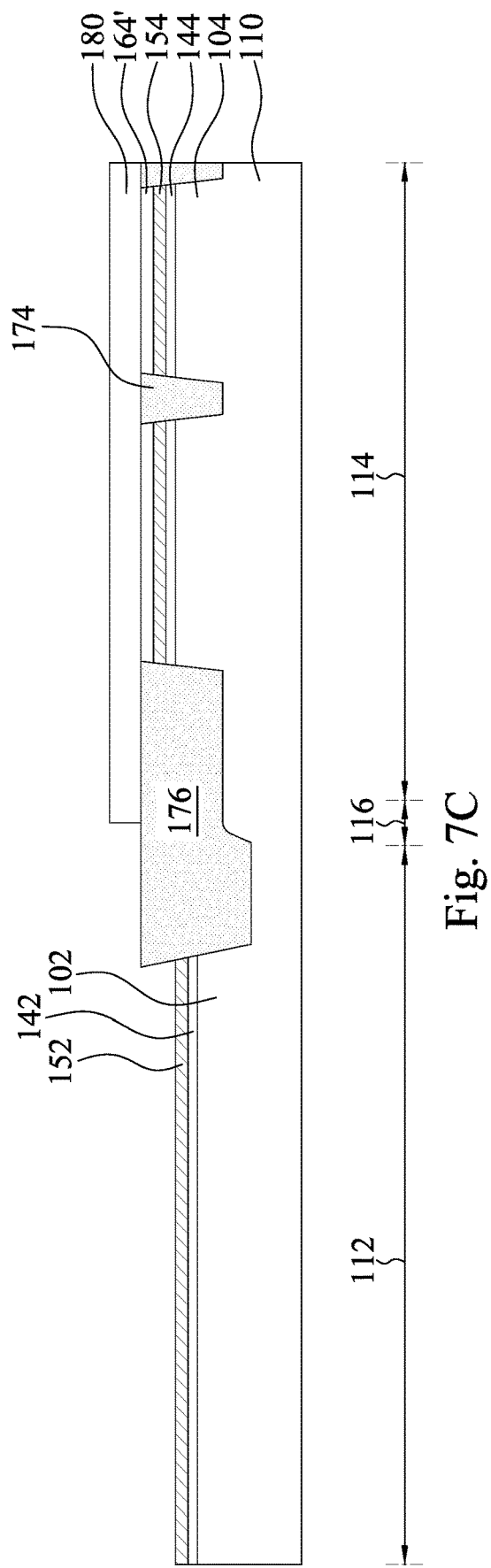
Figure 7D:
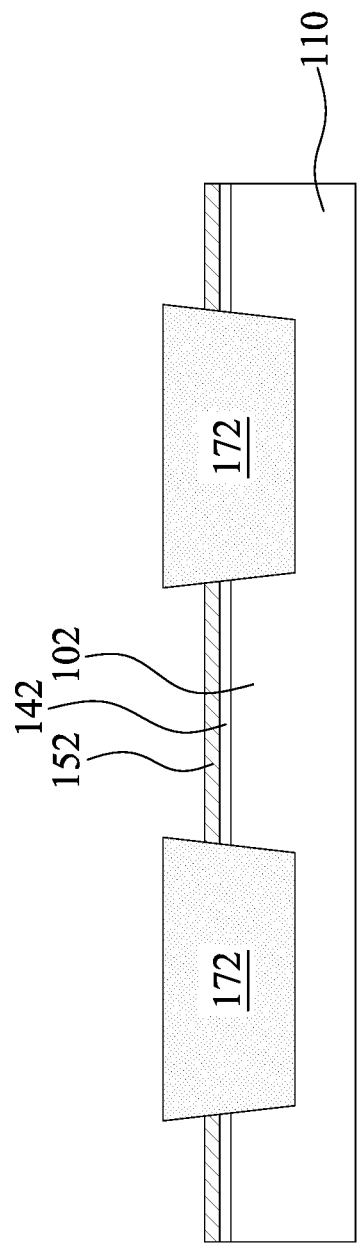

Reference is made to FIGS. 7A to 7D, where FIG. 7A is a top view of the IC, FIG. 7B is a cross-sectional view taken along line B-B of FIG. 7A, FIG. 7C is a cross-sectional view taken along line C-C of FIG. 7A, and FIG. 7D is a cross-sectional view taken along line D-D of FIG. 7A. A patterned mask layer 180 is formed over the peripheral region 114 of the substrate 110 to cover the mask layers 164, the isolation features 174, and a portion of the isolation feature 176. The patterned mask layer 180 exposes the mask layers 162' (referring to FIGS. 6A to 6D), the isolation features 172, and a portion of the isolation feature 176. The patterned mask layer 180 may include suitable photoresist patterned by lithography process. The mask layer 162' (referring to FIGS. 6A to 6D) is then etched and removed by suitable acid (e.g., phosphorus acid and HF) through the patterned mask layer 180, thereby exposing the floating gate layer 152. The isolation features 174 and the isolation feature 176 may have a higher resistance to the acid than that of the mask layer 162' (referring to FIGS. 6A to 6D), thereby remaining substantially intact after removing the mask layer 162' (referring to FIGS. 6A to 6D). In some other embodiments, removing the mask layer 162' (referring to FIGS. 6A to 6C) may slightly lower the top surfaces of the isolation features 172 and the exposed portion of the isolation feature 176.

Figure 8A:
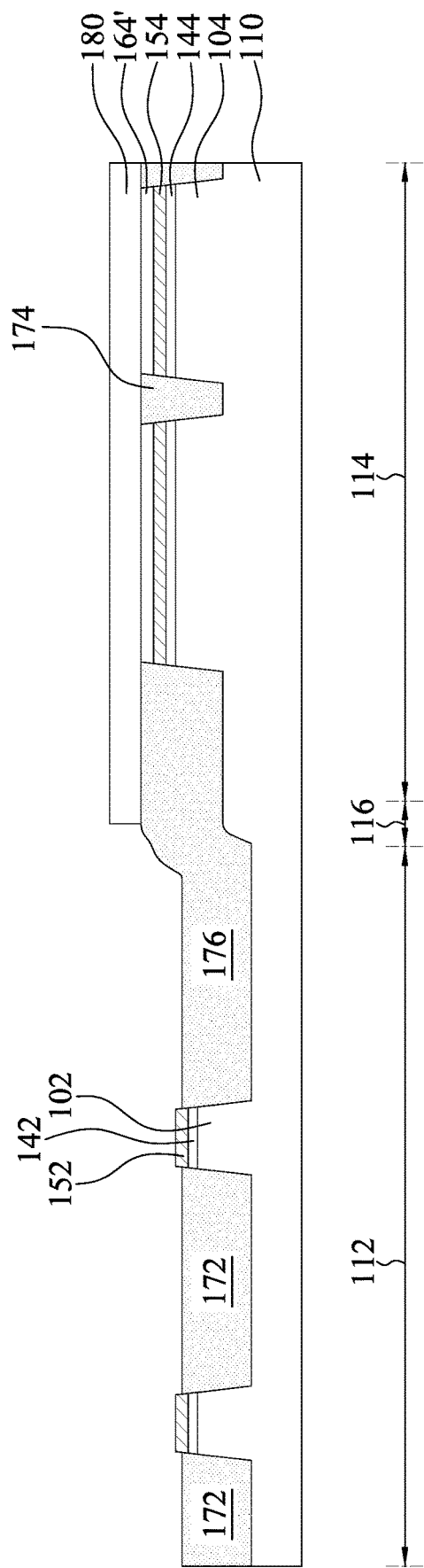
Figure 8B:
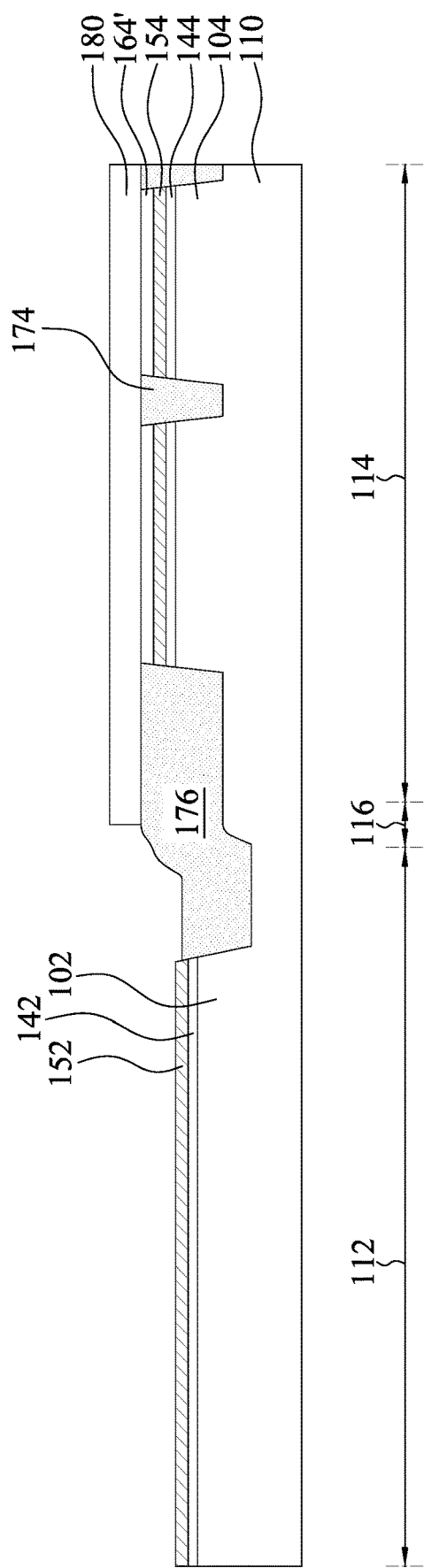
Figure 8C:
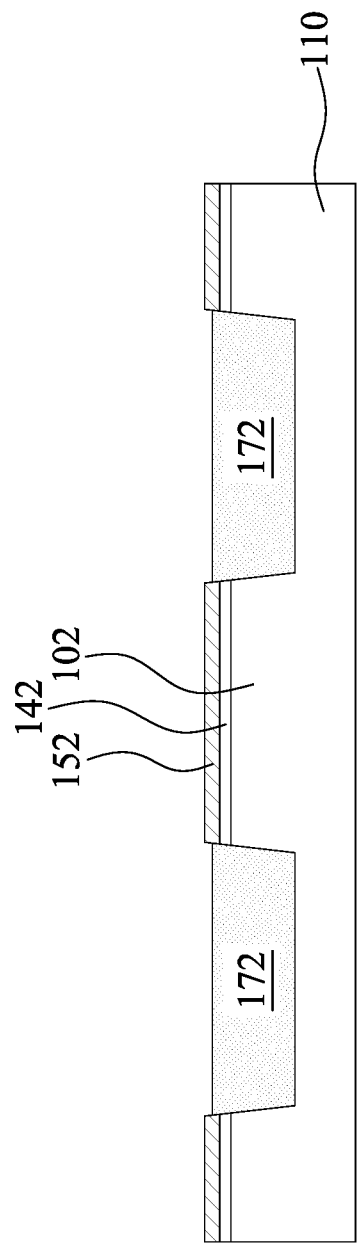

Reference is made to FIGS. 8A to 8C, where the cross-sectional positions of FIGS. 8A to 8C are respectively the same as the cross-sectional position of FIGS. 7B to 7D. The isolation features 172 and the portion of the isolation feature 176 uncovered by the patterned mask layer 180 are recessed until the top surfaces of the isolation features 172 and 176 are lower than the top surface of the floating gate layer 152. The top surfaces of the isolation features 172 and 176 can be higher than the bottom surface of the floating gate layer 152 in some embodiments. In some embodiments, the isolation features 172 and 176 can be recessed by performing a wet etching process, and the present disclosure is not limited in this respect. After the isolation features 172 and 176 are recessed, the top surface of the isolation feature 176 is not planar and may have a step adjacent to the edge of the patterned hard mask layer 180.

Figure 9A:
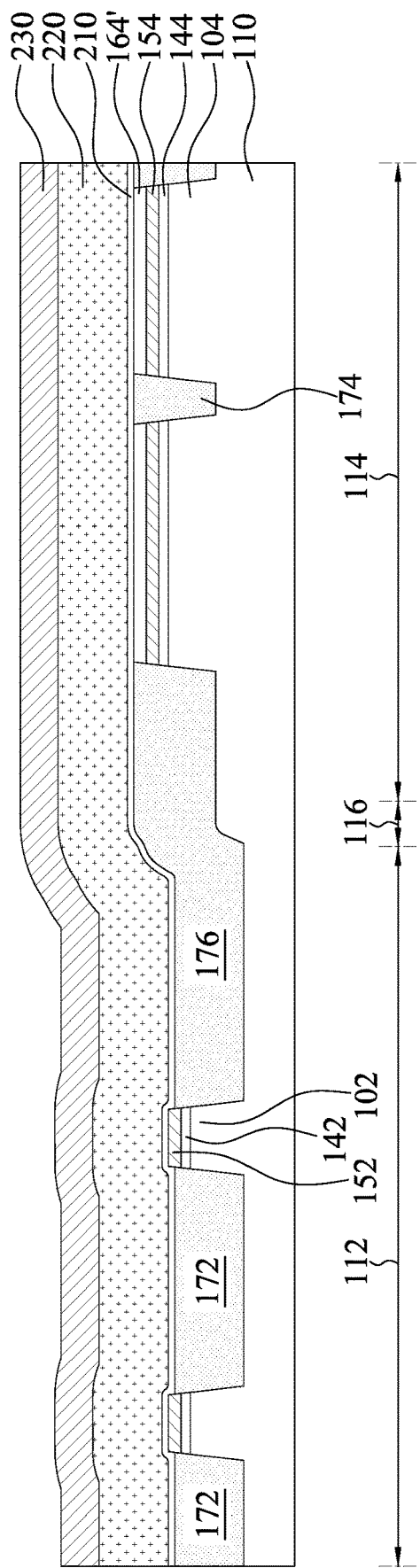
Figure 9B:
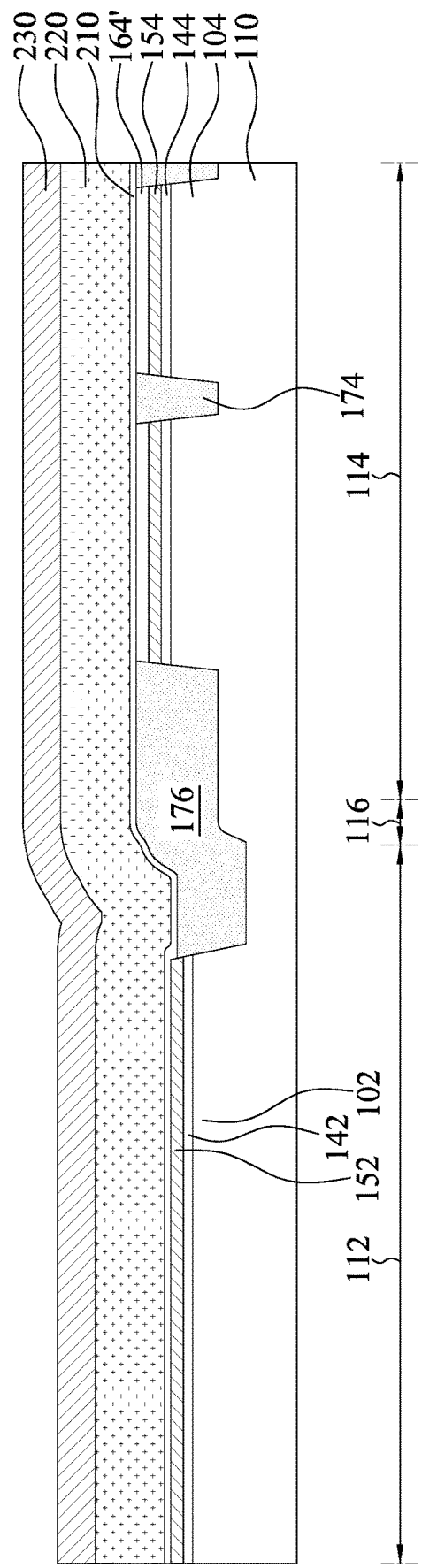
Figure 9C:
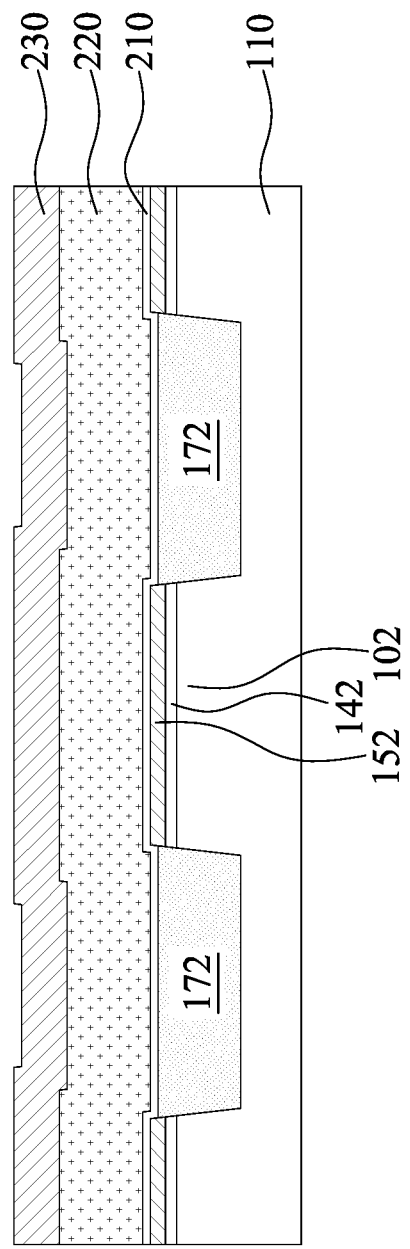

Reference is made to FIGS. 9A to 9C, where the cross-sectional positions of FIGS. 9A to 9C are respectively the same as the cross-sectional position of FIGS. 8A to 8C. The patterned mask layer 180 (referring to FIGS. 8A and 8B) is removed, and the removal method may be performed by solvent stripping or plasma ashing, for example. A dielectric film 210 is then conformally formed over the structure of FIGS. 8A-8C without the patterned hard mask layer 180. In some embodiments, the dielectric film 210 and the tunneling layer 144 may have the same or different materials. That is, the dielectric film 210 may include, for example, a dielectric material such as silicon dioxide ($SiO_2$), silicon nitride ($Si_3N_4$), oxynitrides (SiON), high-k materials, other non-conductive materials, or combinations thereof. The dielectric film 210 may be formed using chemical vapor deposition (CVD), physical vapor deposition (PVD), atomic layer deposition (ALD), ozone oxidation, other suitable processes, or combinations thereof.

A control gate film 220 is conformally formed over the dielectric film 210. The control gate film 220 may include polysilicon formed through, for example low pressure CVD (LPCVD) methods, CVD methods and PVD sputtering methods employing suitable silicon source materials. If desired, the control gate film 220 may be ion implanted to the desired conductive type. It is to be appreciated other gate electrode material such as metal, metal alloys, single crystalline silicon, or combinations thereof.

A hard mask layer 230 is conformally formed over the control gate film 220. The hard mask layer 230 may include single layer or multiple layers. In some embodiments, the hard mask layer 230 includes $SiN/SiO_2/SiN$ stacked layers or other suitable materials. In some embodiments, the hard mask layer 230 may be formed using chemical vapor deposition (CVD), physical vapor deposition (PVD), atomic layer deposition (ALD), ozone oxidation, other suitable processes, or combinations thereof.

Figure 10A:
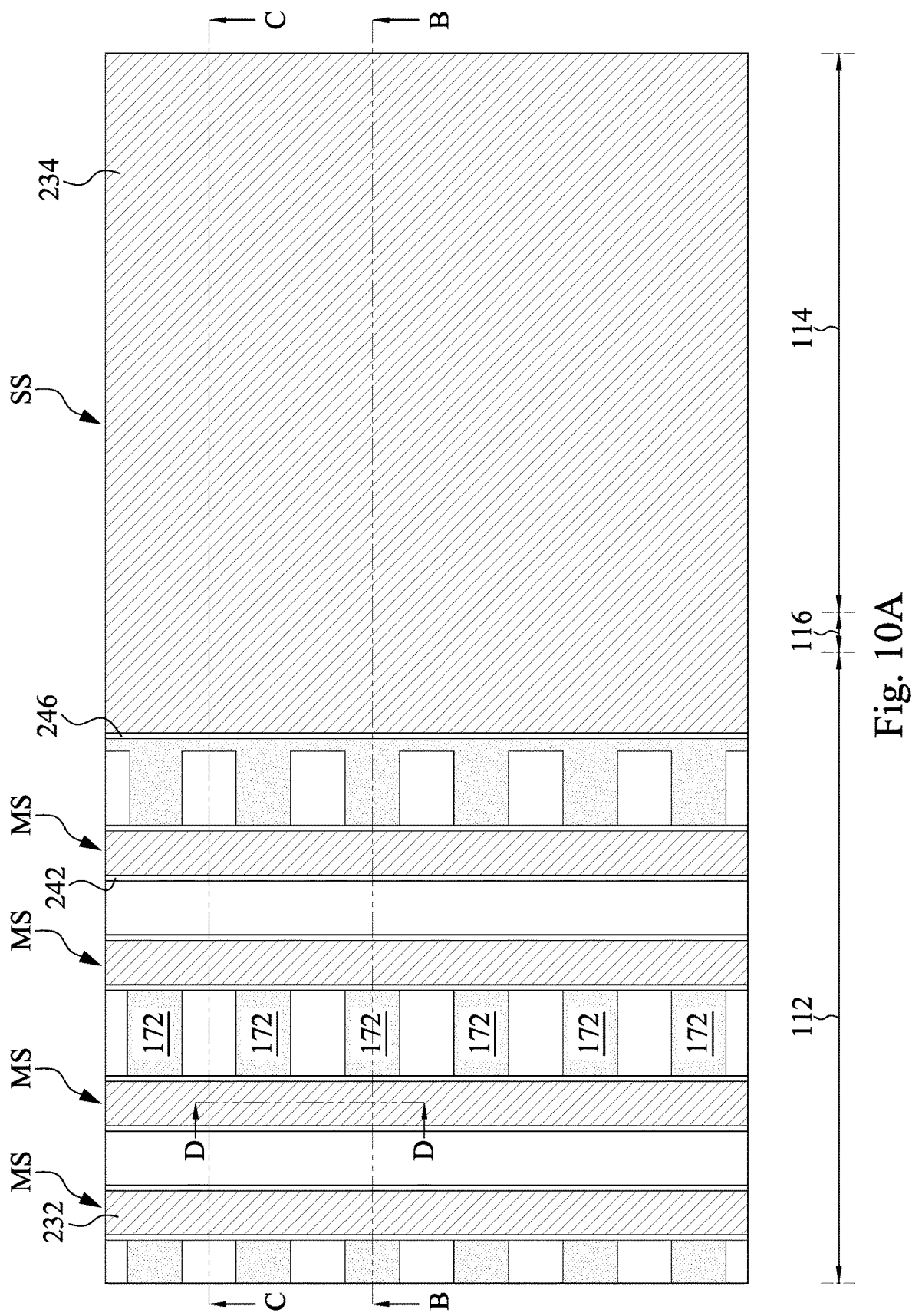
Figure 10B:
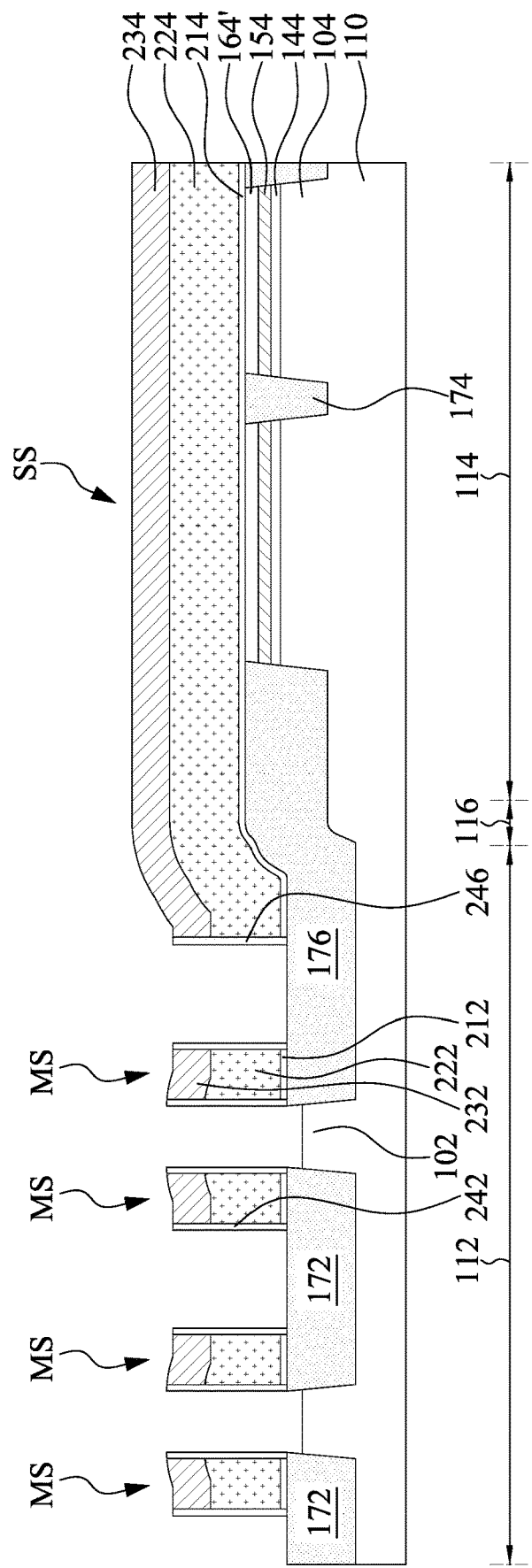
Figure 10C:
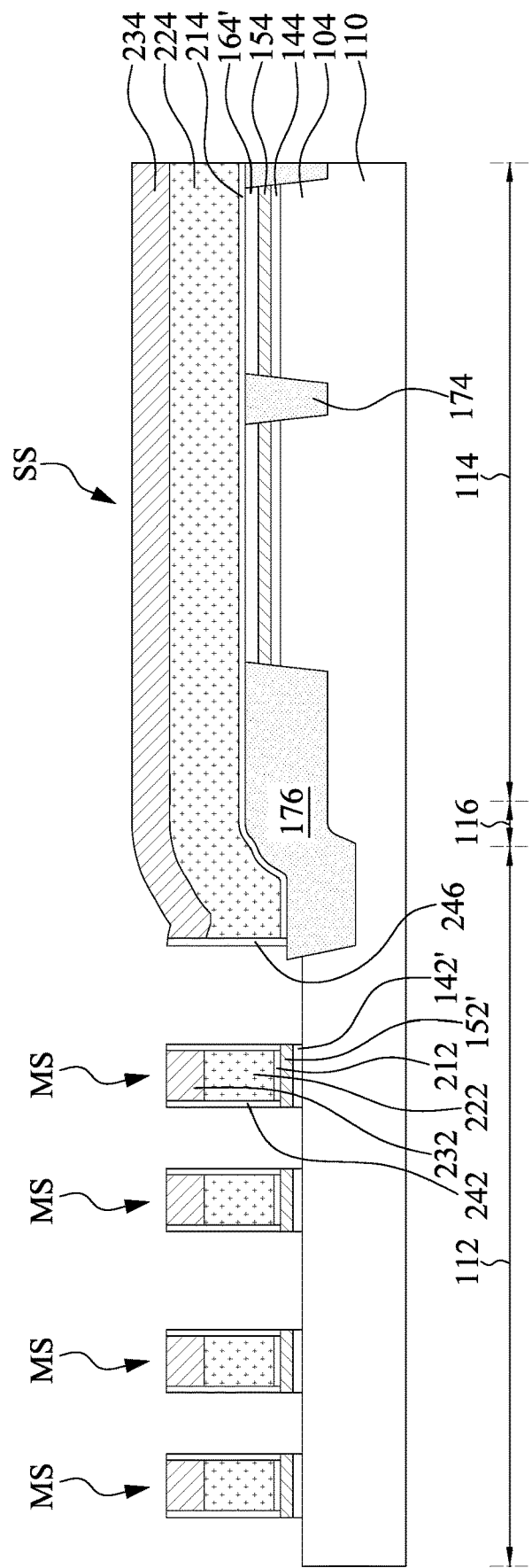
Figure 10D:
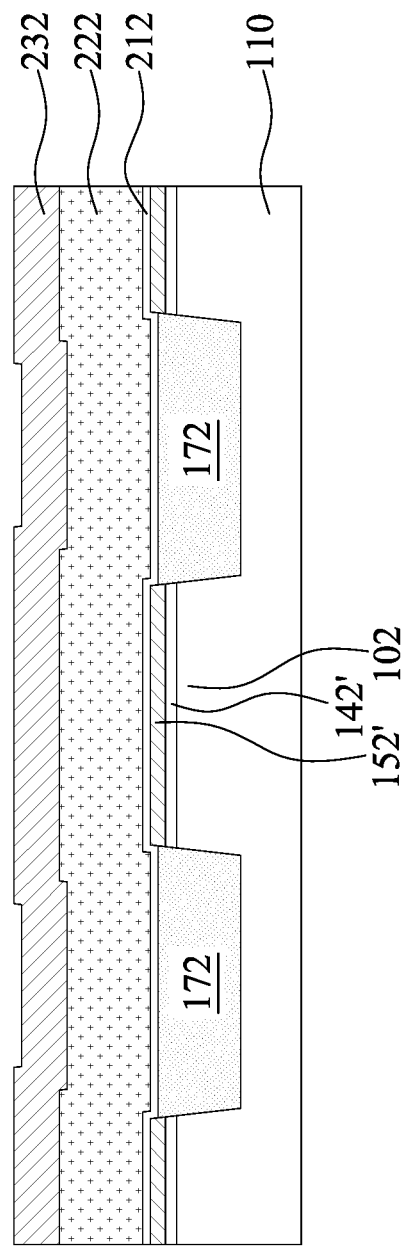

Reference is made to FIGS. 10A to 10D, where FIG. 10A is a top view of the IC, FIG. 10B is a cross-sectional view taken along line B-B of FIG. 10A, and FIG. 10C is a cross-sectional view taken along line C-C of FIG. 10A, and FIG. 10D is a cross-sectional view taken along line D-D of FIG. 10A. The hard mask layer 230, the control gate film 220, the dielectric film 210, the floating gate layer 152, and the tunneling layer 142 (referring to FIGS. 9A-9C) are patterned to form a plurality of memory stacks MS over the cell region 112 of the substrate 110.

Specifically, the hard mask layer 230 is patterned into hard masks 232 over the cell region 112 and a hard mask layer 234 over the peripheral region 114. The control gate film 220 is patterned into control gates 222 over the cell region 112 and a control gate layer 224 over the peripheral region 114. The dielectric film 210 is patterned into dielectric layers 212 over the cell region 112 and a dielectric layer 214 over the peripheral region 114. In some embodiments, a combination of one of the dielectric layers 212, one of the control gates 222, and one of the hard masks 232 may be referred to as a control gate stack. In some embodiments, a combination of the hard mask layer 234, the control gate layer 224, and the dielectric layer 214 may be referred to a semiconductor stack SS.

After patterning the hard mask layer 230, the control gate film 220, and the dielectric film 210, plural spacers are formed on sidewalls of the control gate stacks and the semiconductor stack SS. For example, plural pairs of spacers 242 are disposed over the floating gate layer 152 (referring to FIGS. 9A-9C) and on opposite sidewalls of the control gate stacks. A spacer 246 may be formed on a sidewall of the semiconductor stack SS. In some embodiments, the spacers 242 and 246 include an inner silicon oxide layer, a middle silicon nitride layer, and an outer silicon oxide layer. In some embodiments, after the patterning the hard mask layer 230, the control gate film 220, and the dielectric film 210, a dielectric film may be conformally formed over the control gate stacks and the semiconductor stack SS, and an etching process is performed to remove the horizontal portions of the dielectric film, thereby forming the spacers 242 and 246.

After the formation of the spacers 242 and 246, one or more etching processes are performed to the floating gate layer 152 and the tunneling layer 142 (referring to FIGS. 9A-9C) using the hard masks 232, the hard mask layer 234, and the spacers 242 and 246 as etch mask. Through the etching processes, the floating gate layer 152 and the tunneling layer 142 (referring to FIGS. 9A-9C) are patterned into floating gates 152' and tunneling layers 142', respectively. Through the configuration, at least one of the memory stacks MS 300 includes a floating gate stack and a control gate stack over the floating gate stack, in which the floating gate stack includes a tunneling layer 142' and a floating gate 152' thereon, and the control gate stack includes a dielectric layer 212, a control gate 222, and a hard mask 232.

In some cases where floating gate are formed by depositing floating gate materials into trenches/opening surrounded by isolation features, the formed floating gates may have a rounded bottom shape, such as a bowl shape according to the shape of the trenches/opening due to trench etching process. Voids may be formed between the formed floating gates and the isolation features. Furthermore, according to the shape of the trenches/opening, sidewalls of the formed floating gates may extend past sidewalls of the active regions of the substrate. For example, a size of the bottom surface or top surface of floating gates 152' may be greater than a top surface of the underlying active region of the substrate 110.

In the embodiments of the present disclosure, the isolation features 172 are formed after the deposition of the floating gate film, and therefore the formation of the floating gates 152' does not include depositing the polysilicon material into trenches/opening surrounding by the isolation features 172. Through the configuration, due to the presence of the etch mask (e.g., the hard mask layer 162' in FIGS. 5A-5D), the floating gates 152' and the tunneling layers 142' are aligned with respect to the underlying active region of the substrate 110 (i.e., the base portions 102 of the substrate 110). For example, the sidewalls of the floating gates 152', the tunneling layers 142', and the base portions 102 of the substrate 110 are aligned with each other. Furthermore, in the embodiments of the present disclosure, a size of a bottom surface of the floating gates 152' is equal to or less than a top surface of the underlying active region of the substrate 110 (i.e., the base portions 102 of the substrate 110). In the embodiments of the present disclosure, voids be between the formed floating gates and the isolation features are reduced or eliminated.

Figure 11A:
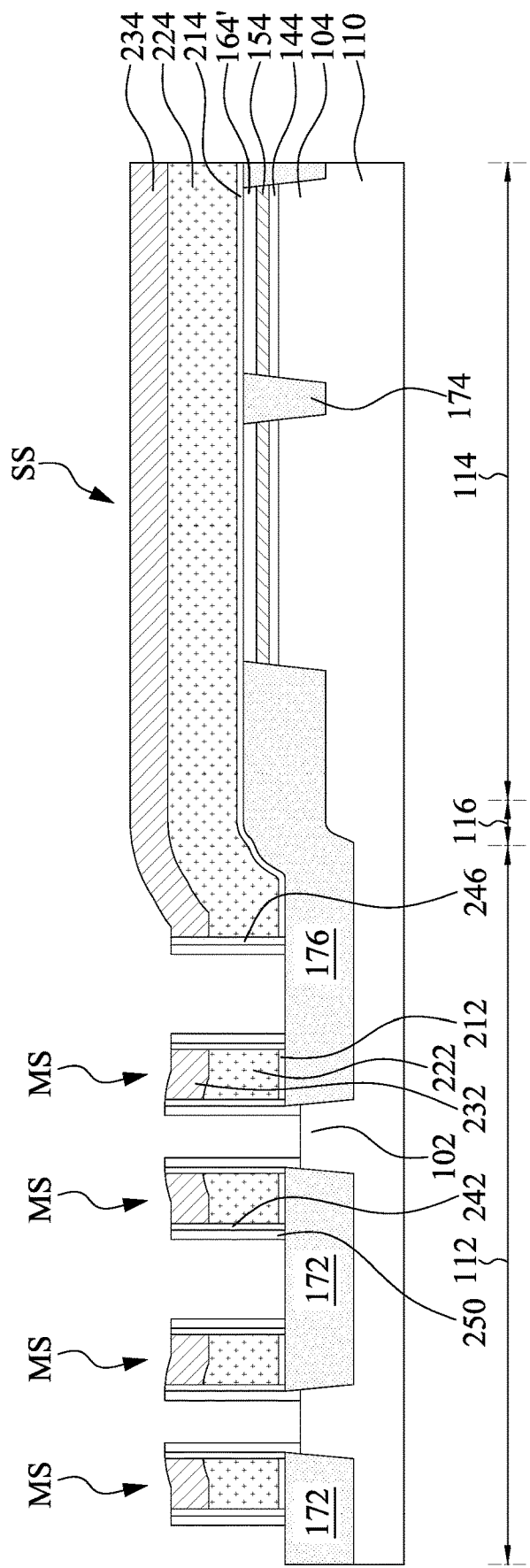
Figure 11B:
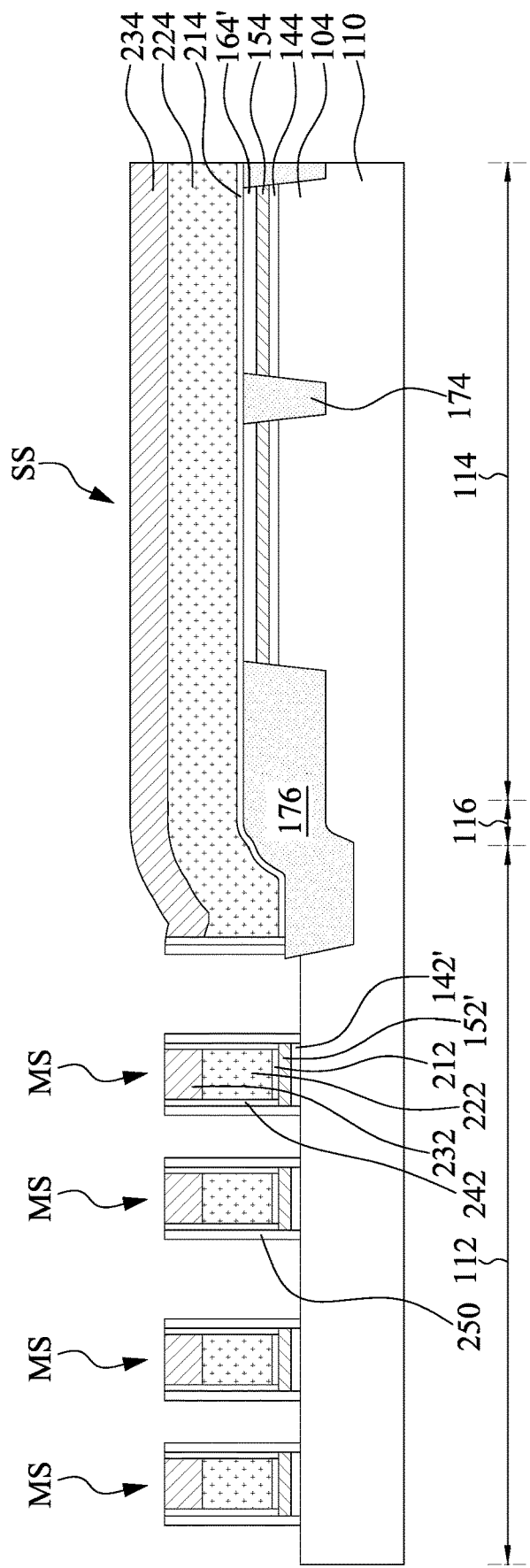

Reference is made to FIGS. 11A and 11B, where the cross-sectional positions of FIGS. 11A and 11B are respectively the same as the cross-sectional position of FIGS. 10B and 10C. Dielectric layers 250 are formed on opposite sides of the memory stacks MS. In some embodiments, the dielectric layers 250 are high temperature oxide layer or other suitable dielectric layers. In some embodiments, a dielectric film may be conformally formed over the structure of FIGS. 10A to 10D, and an etching process is performed to remove the horizontal portions of the dielectric film to form the dielectric layers 250.

Figure 12A:
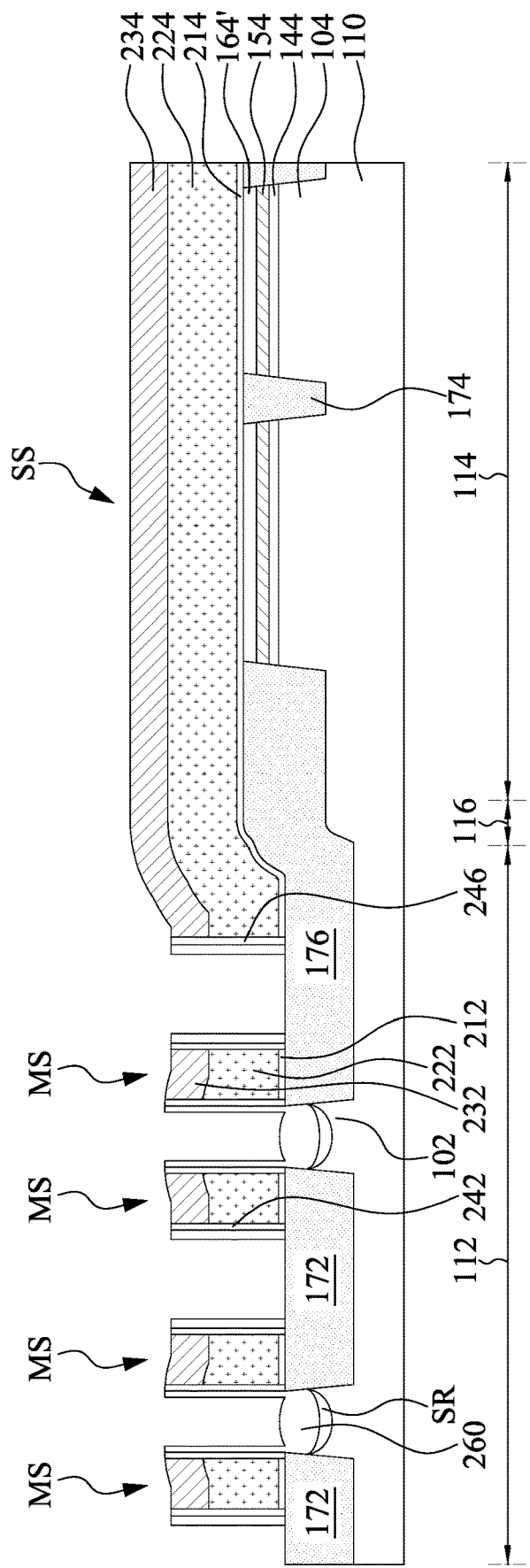
Figure 12B:
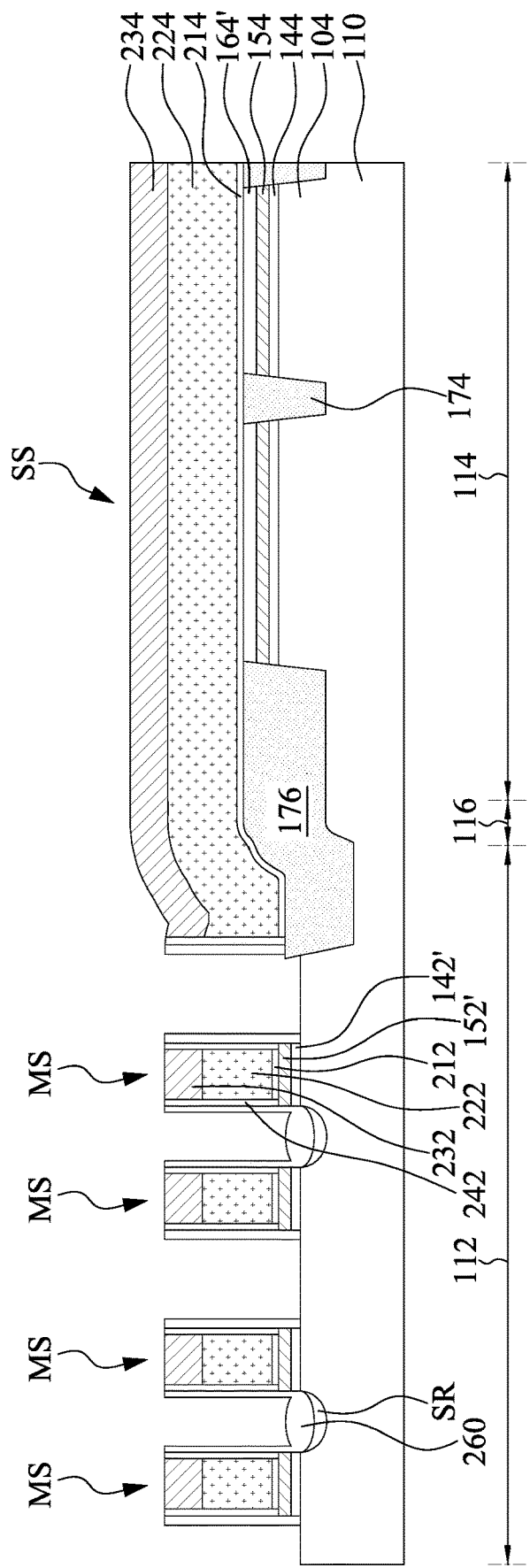

Reference is made to FIGS. 12A and 12B, where the cross-sectional positions of FIGS. 12A and 12B are respectively the same as the cross-sectional position of FIGS. 11A and 11B. The dielectric layers 250 between adjacent two memory stacks MS are removed, and source regions SR are formed between two adjacent memory stacks MS. For example, a patterned photoresist layer is formed by a combination of spin coating, exposing and developing processes to expose areas of the substrate 110 between adjacent memory stacks MS. The exposed dielectric layers 250 are then removed, and ions are implanted into the areas to form the source regions SR. A common source (CS) dielectric layer 260 is formed over the source region SR. The CS dielectric layer 260 may be a dielectric isolation structure and may be formed by oxidizing the substrate 110, other suitable processes, or combinations thereof. The patterned photoresist layer is then removed, and the removal method may be performed by solvent stripping or plasma ashing, for example.

Figure 13A:
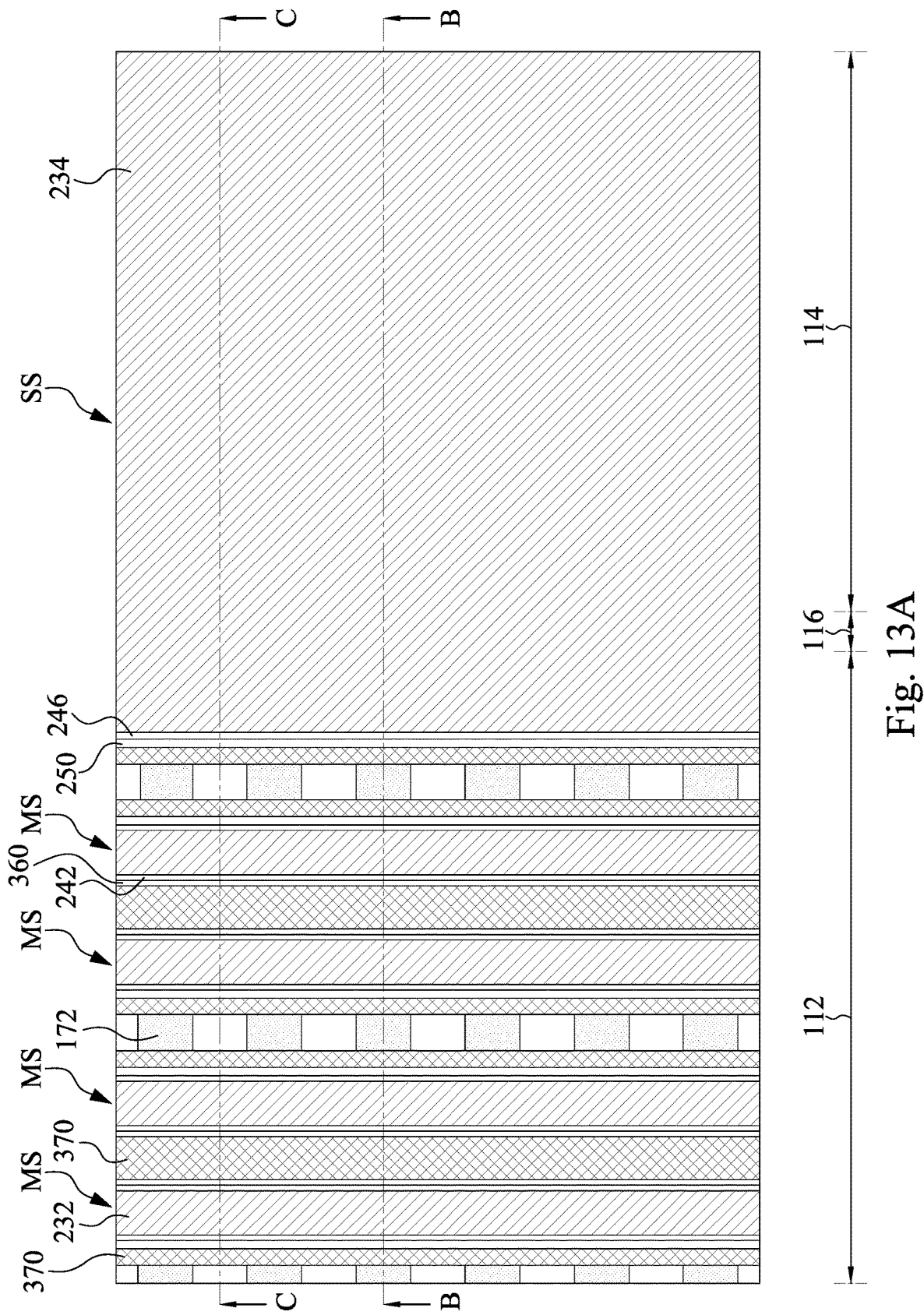
Figure 13B:
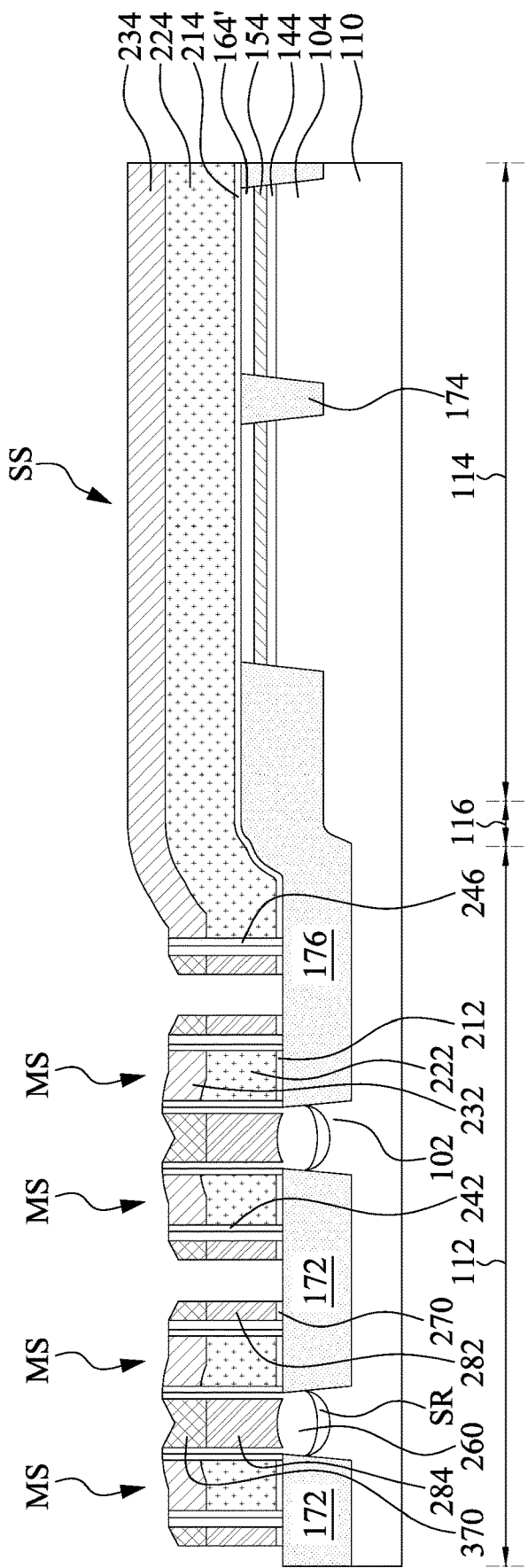
Figure 13C:
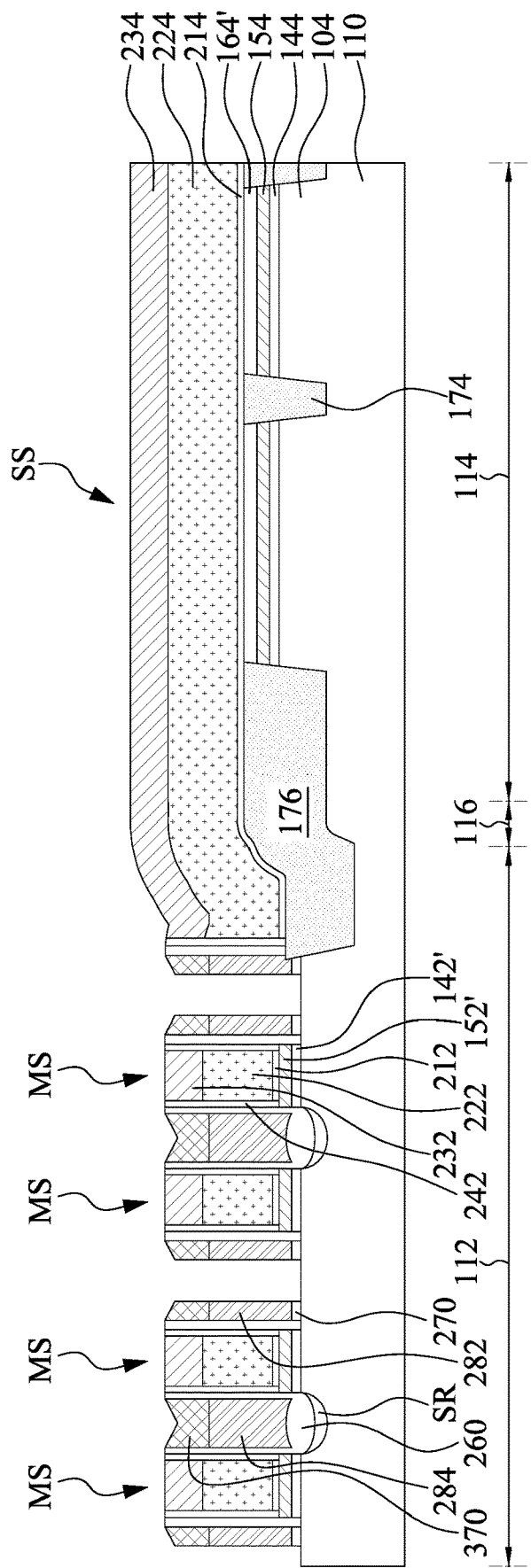

Reference is made to FIGS. 13A to 13C, where FIG. 13A is a top view of the IC, FIG. 13B is a cross-sectional view taken along line B-B of FIG. 13A, and FIG. 13C is a cross-sectional view taken along line C-C of FIG. 13A. In the present embodiments, plural select gate dielectric layers 270 and plural select gates (or word lines) 282 are formed on first sides of the memory stacks MS, and plural erase gates 284 are formed on second sides of the memory stacks MS. For example, a dielectric layer is formed over the substrate 110, for example, by a thermal oxidation process, chemical vapor deposition, or atomic layer deposition, a conductive layer is deposited over the dielectric layer, and then the conductive layer is etched back. Then, plural hard masks 370 are respectively formed over the conductive layer, and another etching process is formed to pattern the conductive layer and the dielectric layer using the hard masks 370 as masks to form the erase gates 284, the select gates 282, and the select gate dielectric layers 270. In some embodiments, the erase gates 284 and the select gates 282 may be made of polysilicon or other suitable materials. If desired, the erase gates 284 and the select gates 282 may be ion implanted to the desired conductive type. For example, the erase gates 284 and the select gates 282 may be in-situ doped. In some embodiments, the select gate dielectric layers 270 may include silicon oxide, silicon nitride, silicon oxynitride, other non-conductive materials, or the combinations thereof.

Figure 14A:
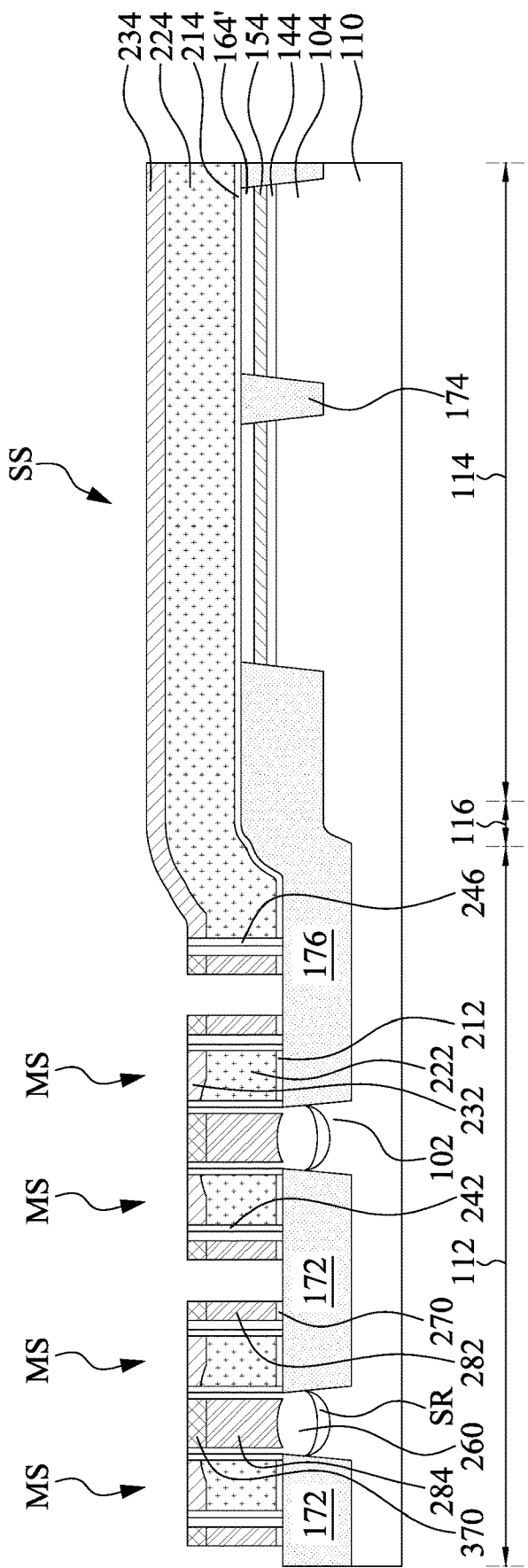
Figure 14B:
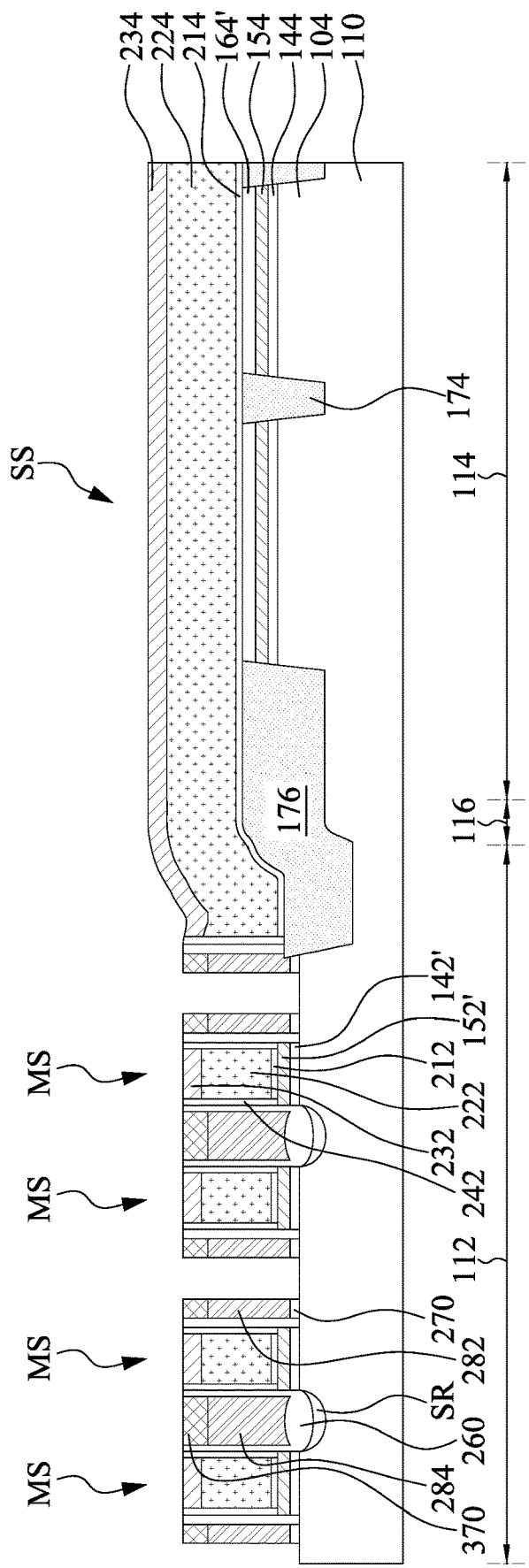

Reference is made to FIGS. 14A and 14B, where the cross-sectional positions of FIGS. 14A and 14B are respectively the same as the cross-sectional position of FIGS. 13B and 13C. The hard masks 370, 232, and 234 are etched back, and the height of the memory stacks MS in the cell region 112 is reduced. In some embodiments, prior to the etching back, a flowable material (i.e., an organic material) is formed on the structure of FIGS. 13B and 13C. Due to the good flowability of the flowable material, the substrate 210 uncovered by the hard masks 370, 232, and 234 are covered by thicker flowable material, thereby the substrate 210 uncovered by the hard masks 370, 232, and 234 are prevented from being damaged during the etch back process. The etch back process may also remove the flowable material.

Figure 15A:
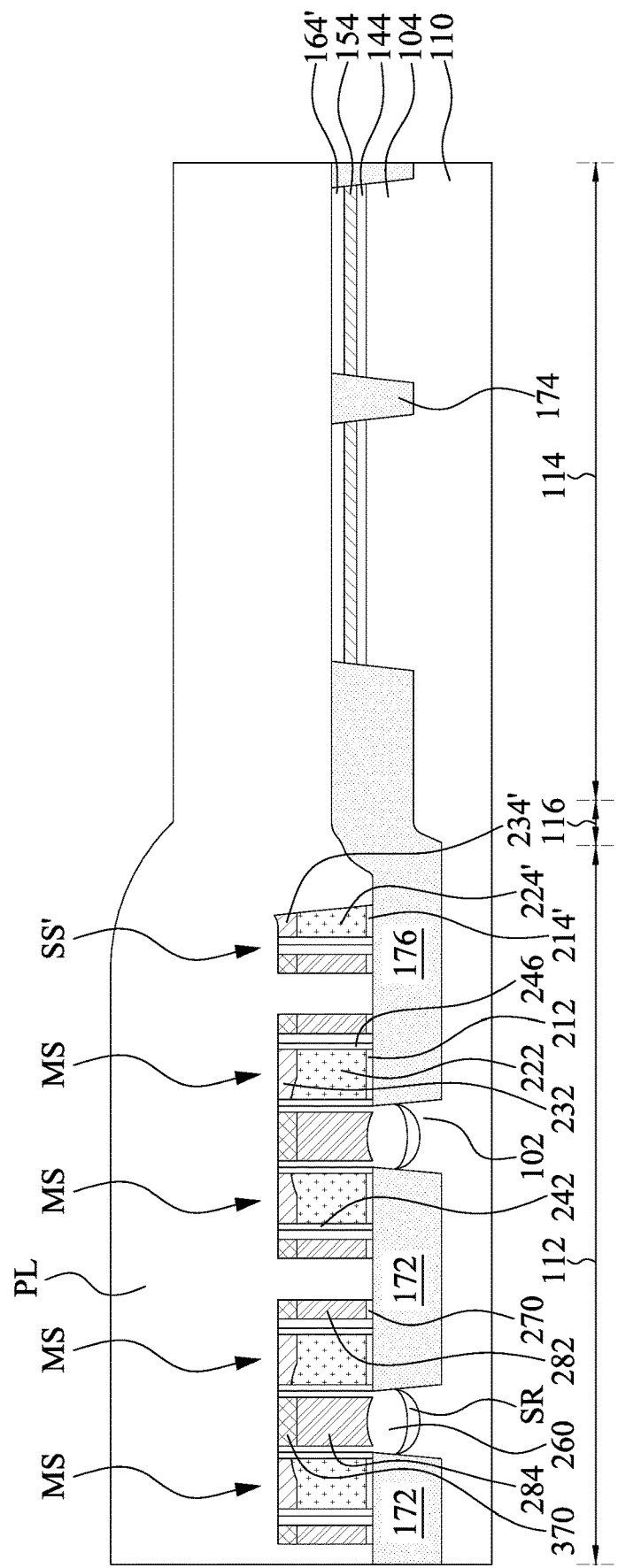

Reference is made to FIGS. 15A and 15B, where the cross-sectional positions of FIGS. 15A and 15B are respectively the same as the cross-sectional position of FIGS. 14A and 14B. The semiconductor stack SS (referring to FIGS. 14A and 14B) including the hard mask layer 234, the control gate layer 224, and the dielectric layer 212 (referring to FIGS. 14A and 14B) is at least partially removed by suitable etching processes, to expose the mask layer 164' and the isolation feature 174. A portion of the semiconductor stack SS (referring to FIGS. 14A and 14B) remains over the isolation feature 176 after the removing process, and is referred to as a semiconductor stack SS' hereinafter. The semiconductor stack' SS includes remaining portions of the hard mask layer 234, the control gate layer 224, and the dielectric layer 212 (referring to FIGS. 14A and 14B), which are referred to as a hard mask layer 234', the control gate layer 224', and the dielectric layer 212'. A protective layer PL is formed over the semiconductor stack SS' and the memory stacks MS. Portions of the protective layer PL may protect the semiconductor stack SS' and the memory stacks MS during the removing process. In some embodiments, the protective layer PL is, for example, made of amorphous silicon, polysilicon, silicon oxide, silicon nitride, silicon oxynitride, other suitable materials, or the combinations thereof. The protective layer PL may be formed by suitable deposition methods, such as CVD or the like.

Figure 16A:
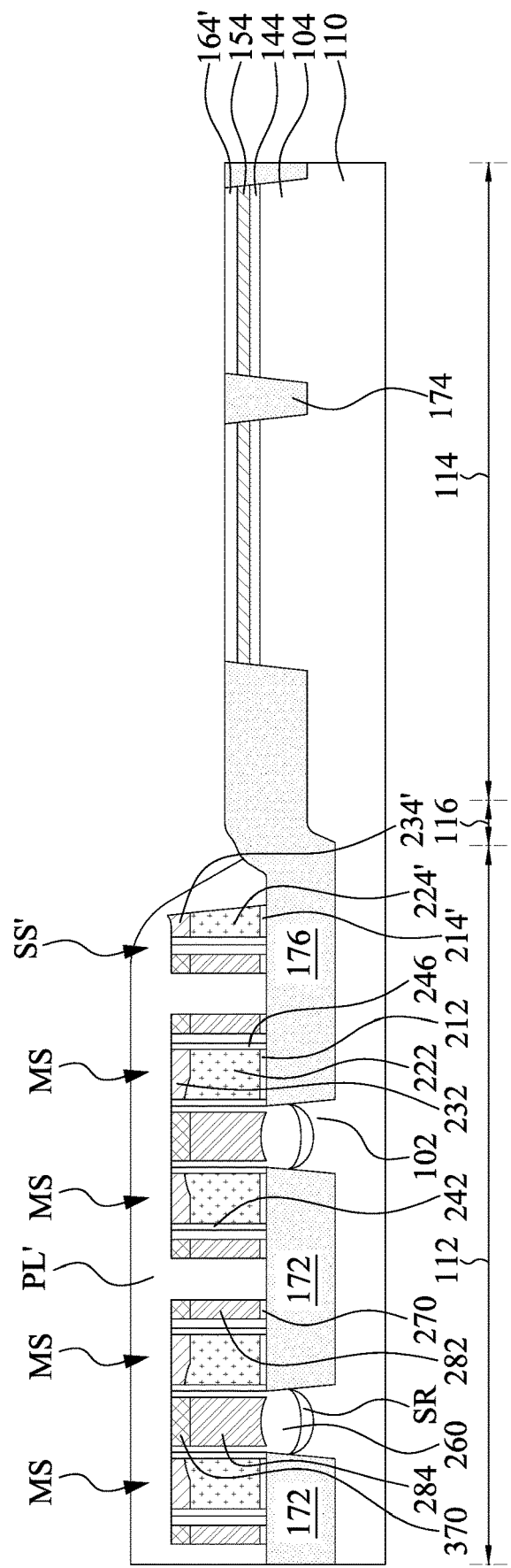
Figure 16B:
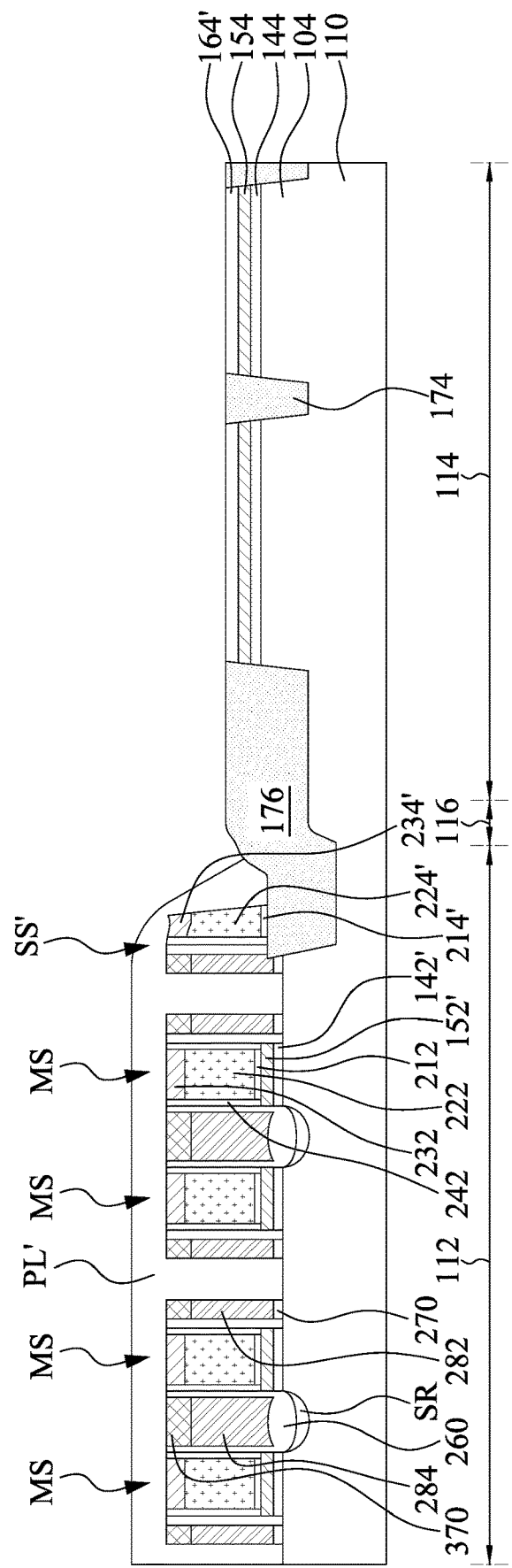

Reference is made to FIGS. 16A and 16B, where the cross-sectional positions of FIGS. 16A and 16B are respectively the same as the cross-sectional position of FIGS. 15A and 15B. An etching back process is performed to the protective layer PL, thereby thinning a thickness of the protective layer PL, such that a portion of the protective layer PL over a portion of the transition region 116 and all the peripheral region 114 is removed. After the etching back process, a remaining portion of the protective layer PL over the cell region 112 is referred to as the protective layer PL'. The protective layer PL' may have a tapered profile and cover the stack SS' and the memory stacks MS, and the protective layer PL' may exposes a portion of the transition region 116 and all the peripheral region 114.

Figure 17A:
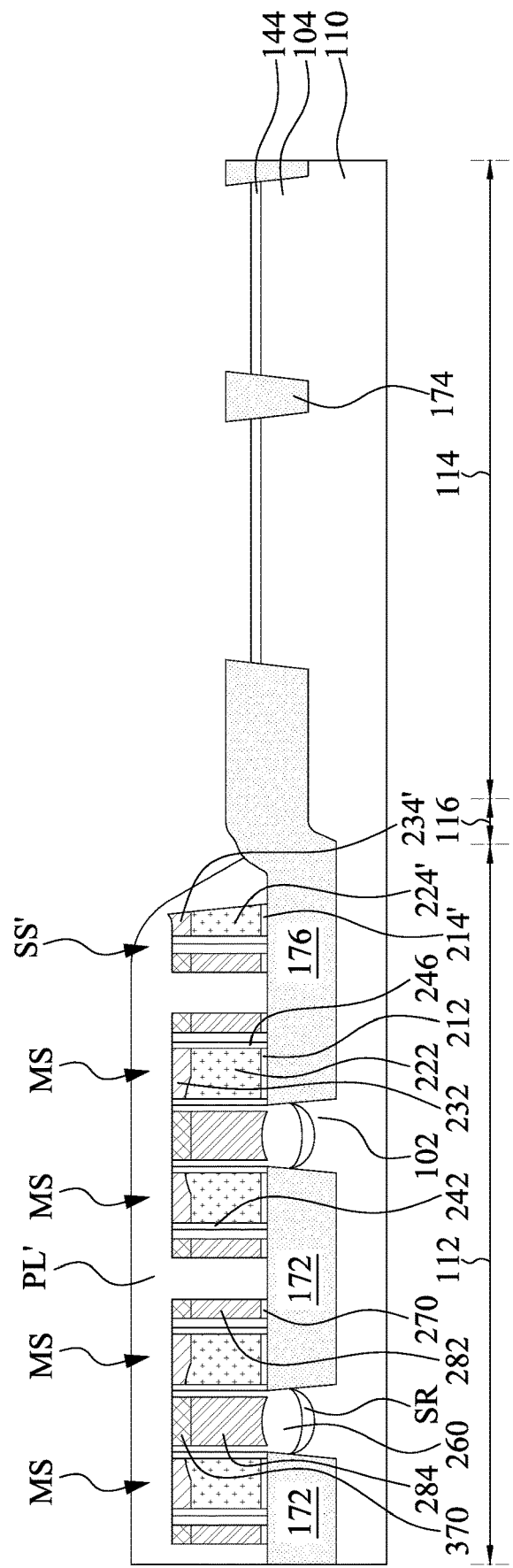
Figure 17B:
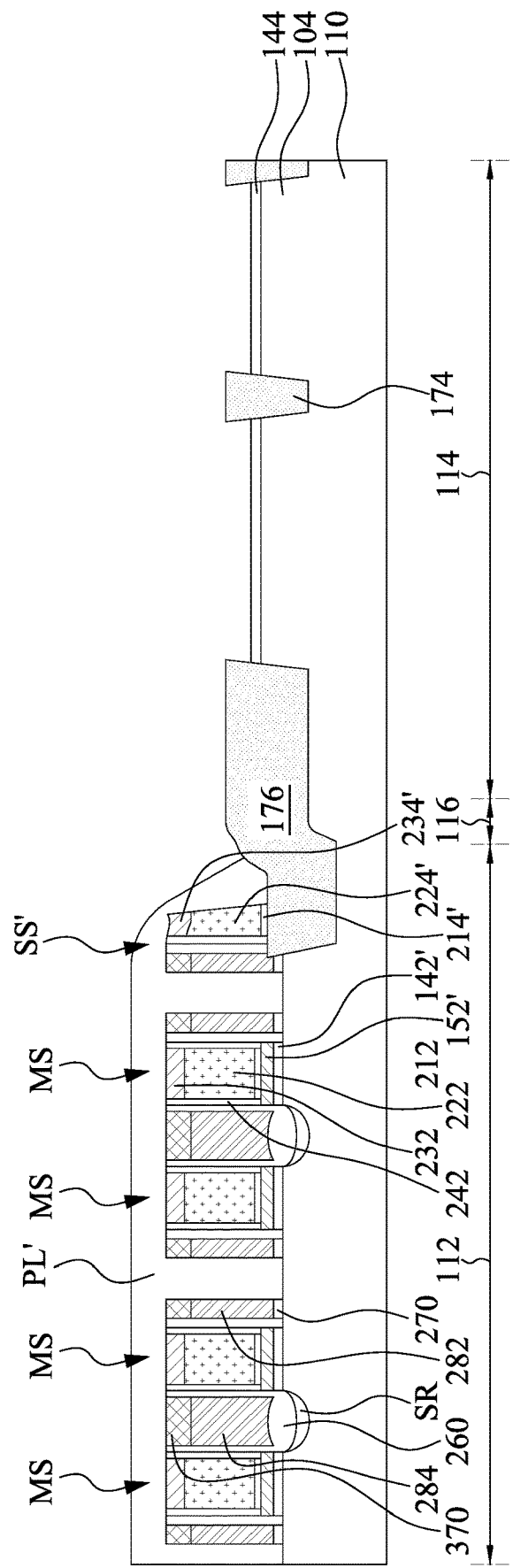

Reference is made to FIGS. 17A and 17B, where the cross-sectional positions of FIGS. 17A and 17B are respectively the same as the cross-sectional position of FIGS. 16A and 16B. A chemical dry etching process is performed to remove the mask layer 164' and the floating gate layer 154 (referring to FIGS. 16A and 16B), thereby exposing the underlying tunneling layer 144, while the stack SS' and the memory stacks MS remain intact because of the protection of the protective layer PL'. In some embodiments, the chemical dry etching process may include one or plural etching process using suitable gas etchants, such as $H_3PO_4$, HF, the combination thereof, or the like. The tunneling layer 144 may have a higher etch resistance to these gas etchants than that of the mask layer 164' and the floating gate layer 154 (referring to FIGS. 16A and 16B), thereby protecting the underlying base portion 104 of the substrate 110 from being etched.

Figure 18A:
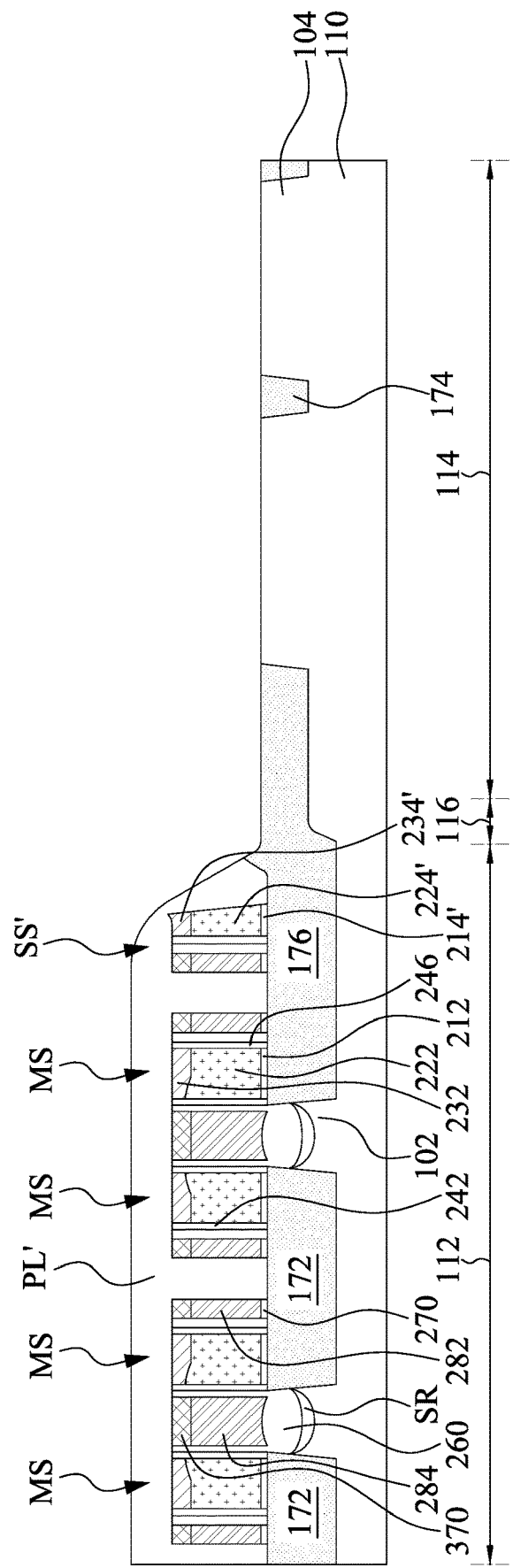
Figure 18B:
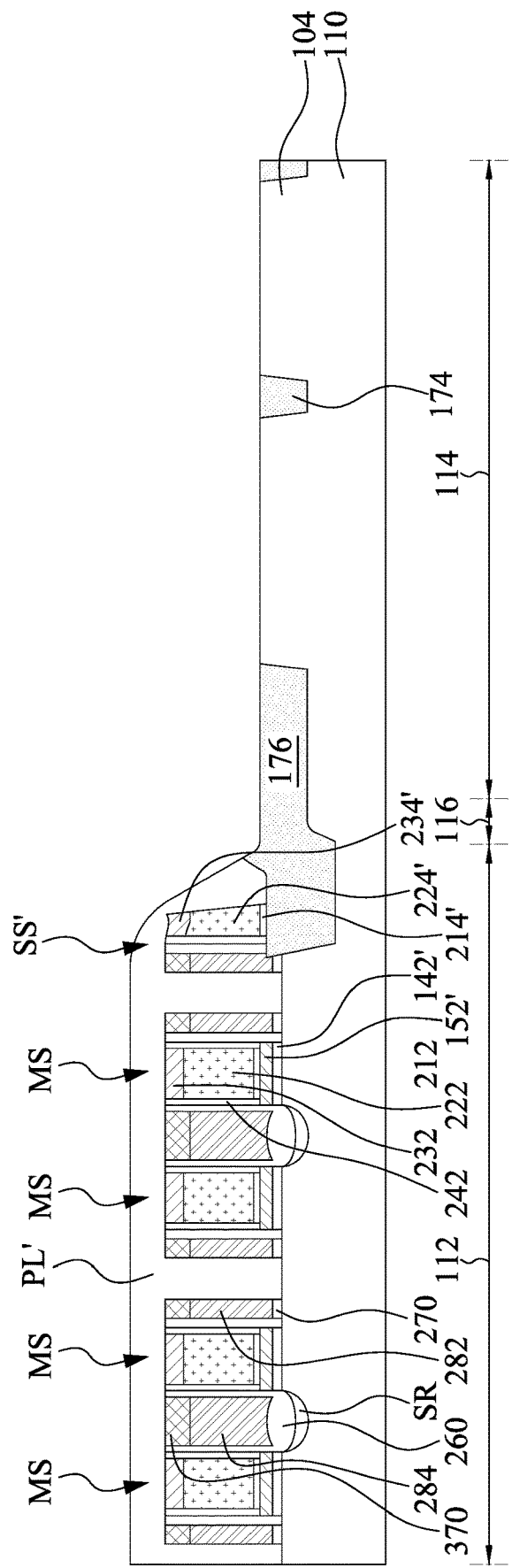

Reference is made to FIGS. 18A and 18B, where the cross-sectional positions of FIGS. 18A and 18B are respectively the same as the cross-sectional position of FIGS. 17A and 17B. An etching process is performed to the tunneling layer 144 (referring to FIGS. 17A and 17B) and the isolation features 176 and 174. The etching process may remove the tunneling layer 144 (referring to FIGS. 17A and 17B) to expose the underlying base portion 104 of the substrate 110, while the stack SS' and the memory stacks MS remain intact because of the protection of the protective layer PL'. The etching process may also recess the isolation features 176 and 174 until the top surfaces of the isolation features 176 and 174 are substantially flush with the base portion 104. Through the etching process, a planar surface is yielded in the peripheral region 114 and a portion of the transition region 116.

Figure 19A:
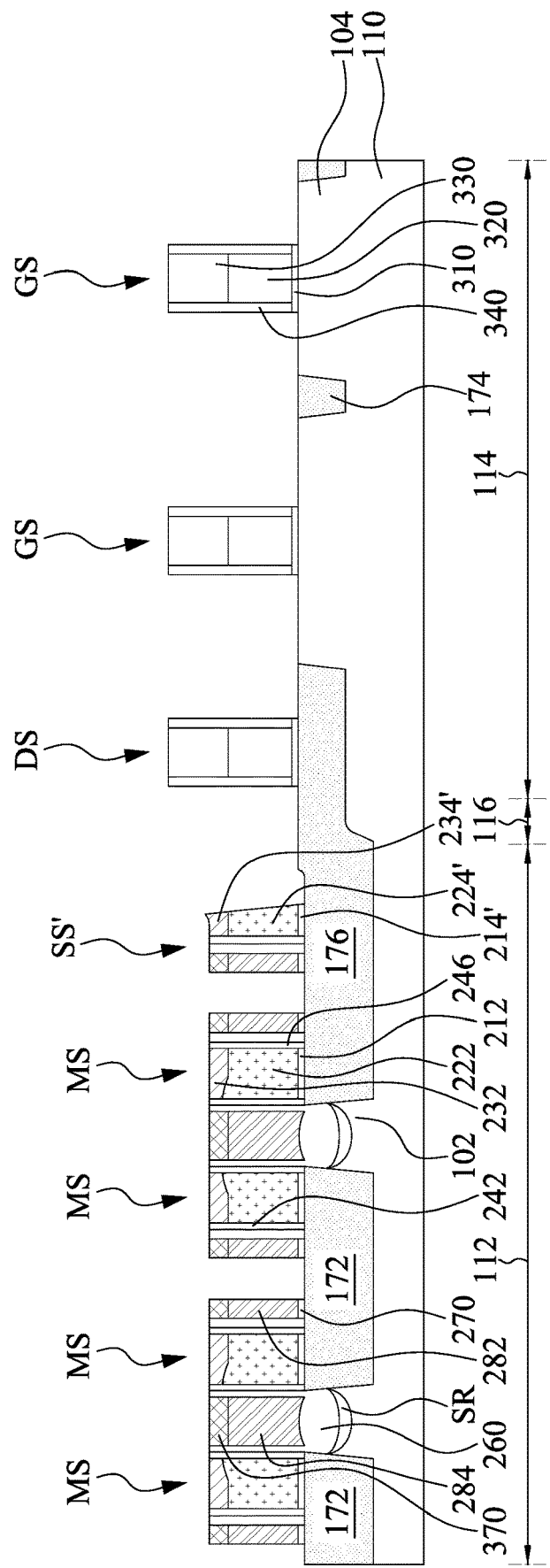
Figure 19B:
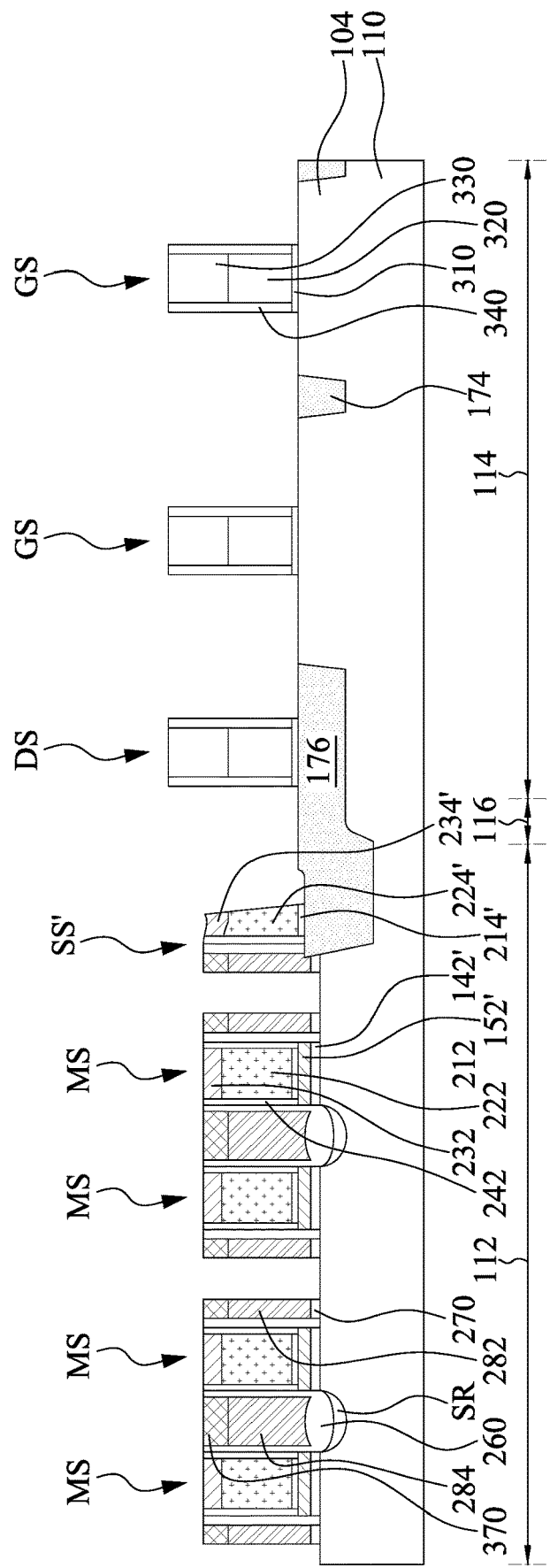

Reference is made to FIGS. 19A and 19B, where the cross-sectional positions of FIGS. 19A and 19B are respectively the same as the cross-sectional position of FIGS. 18A and 18B. Gate stacks GS are formed over the base portions 104 and a dummy gate stack DS is formed over the isolation feature 176. In some embodiments, the gate stacks GS and the dummy gate stack DS include elements of the same materials. For example, each of the gate stacks GS and the dummy gate stack DS may include a gate dielectric 310, a gate electrode 320 over the gate dielectric 310, and a hard mask 330 over the gate dielectric 310.

The formation of the gate stacks GS and the dummy gate stack DS include forming a gate dielectric film over the structure of FIGS. 18A and 18B, depositing a gate electrode film and a hard mask film thereon, and patterning the gate dielectric film, the hard mask film, and the gate electrode film into the gate dielectric 310, the hard masks 330, and the gate electrodes 320. The gate dielectrics 310 may include one or plural suitable dielectric layers. For example, the gate dielectrics 310 may include an oxide layer and a high-k dielectric layer, other non-conductive materials, or combinations thereof. Examples of the high-k material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. The gate electrodes 320 may be made of conductive materials, such as a polysilicon layer. The hard masks 330 may include single layer or multiple layers. In some embodiments, the hard masks 330 includes silicon nitride (SiN) or other suitable materials. In some embodiments, the hard masks 330 includes SiN/$SiO_2$/SiN stacked layers or other suitable materials. In some embodiments, gate spacers 340 are formed on opposite sidewalls of the gate stacks GS and the dummy gate stack DS. After the formation of the gate stacks GS and the dummy gate stack DS, one or more suitable etching processes are performed to remove the protective layer PL' (referring to FIGS. 18A and 18B). In some other embodiments, the protective layer PL' (referring to FIGS. 18A and 18B) may has a portion remaining on a side of the stack SS' after the etching processes.

Figure 20A:
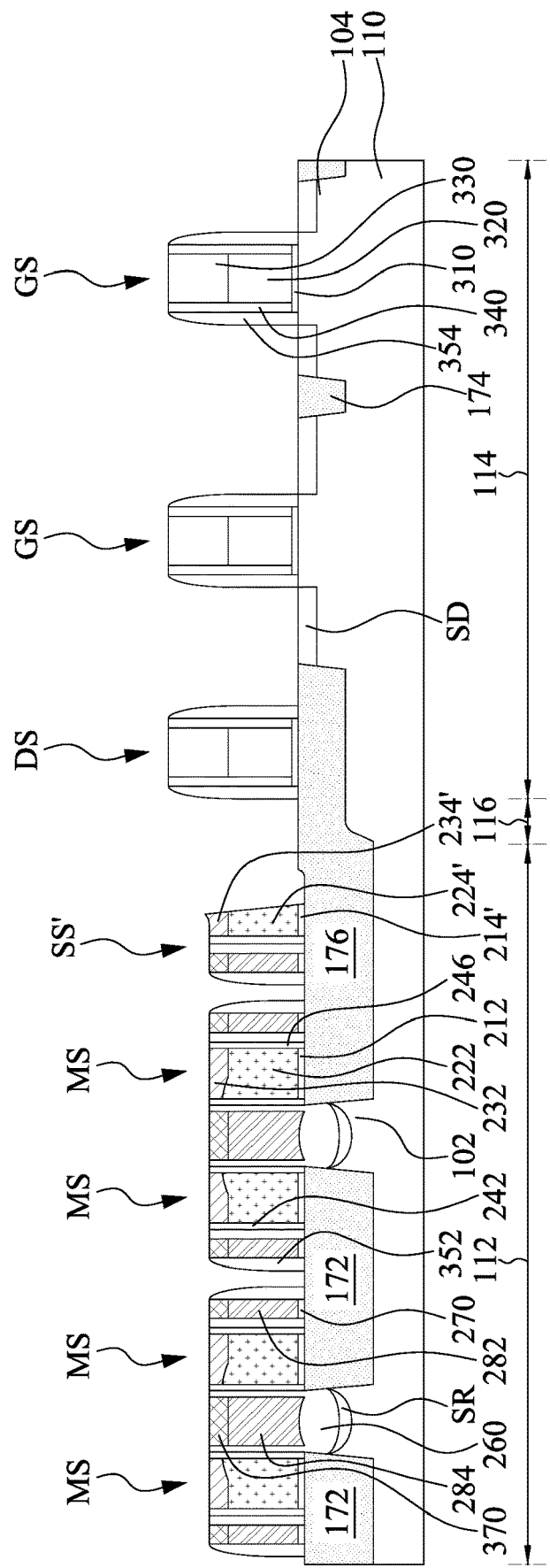
Figure 20B:
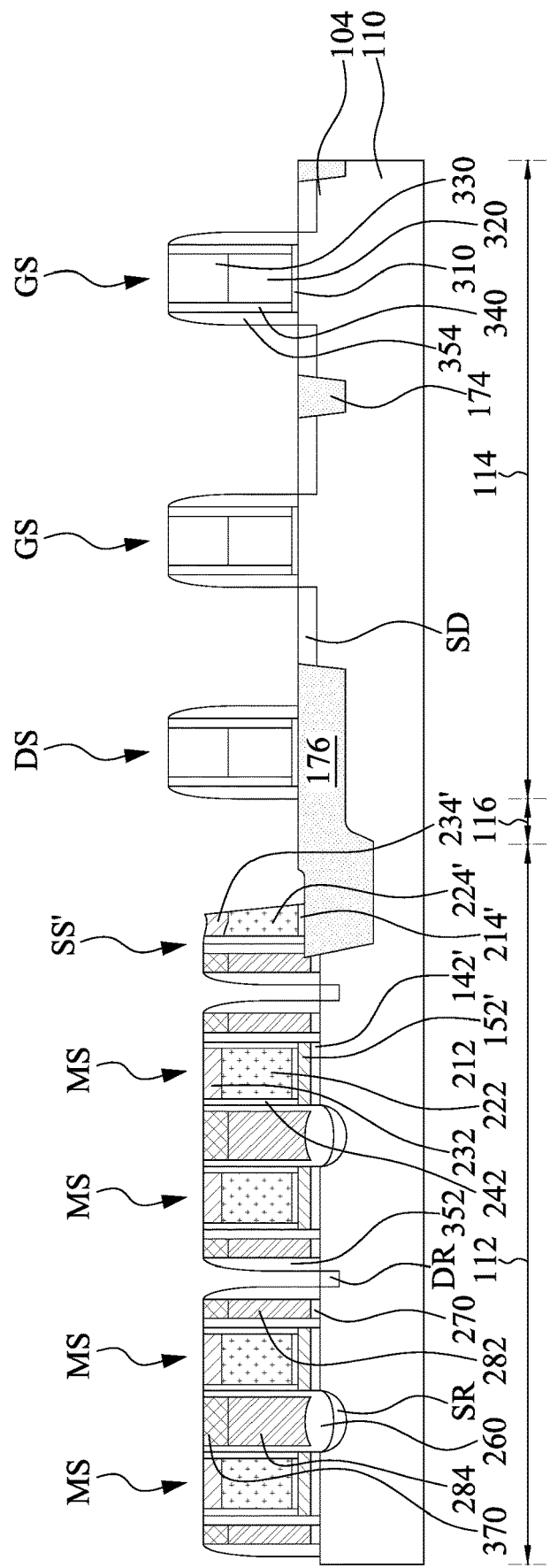

Reference is made to FIGS. 20A and 20B, where the cross-sectional positions of FIGS. 20A and 20B are respectively the same as the cross-sectional position of FIGS. 19A and 19B. One or more implantation processes are performed to the cell region 112 and the peripheral region 114 of the substrate 110, thereby forming drain regions DR in the cell region 112 of the substrate 110 and source/drain regions SD in the peripheral region 114 of the substrate 110. Specifically, the drain regions DR are respectively disposed adjacent to the select gates 282. In other words, the memory stack MS and the select gate 282 are disposed in a position between the source region SR and the drain region DR. In some embodiments, the gate stack GS and the source/drain regions SD in combination form semiconductor devices, such as a high-κ metal gate (HKMG) transistor, and/or a logic transistor. In some embodiments, prior to the implantation processes, gate spacers 352 are formed on sidewalls of the select gates 282, and gate spacers 354 are formed on the opposite sidewalls of the gate stacks GS and the dummy gate stack DS. For example, a dielectric film may be conformally formed over the structure of FIGS. 19A and 19B, and an etching process is performed to remove the horizontal portions of the dielectric film, thereby forming the gate spacers 352 and 354.

Figure 21A:
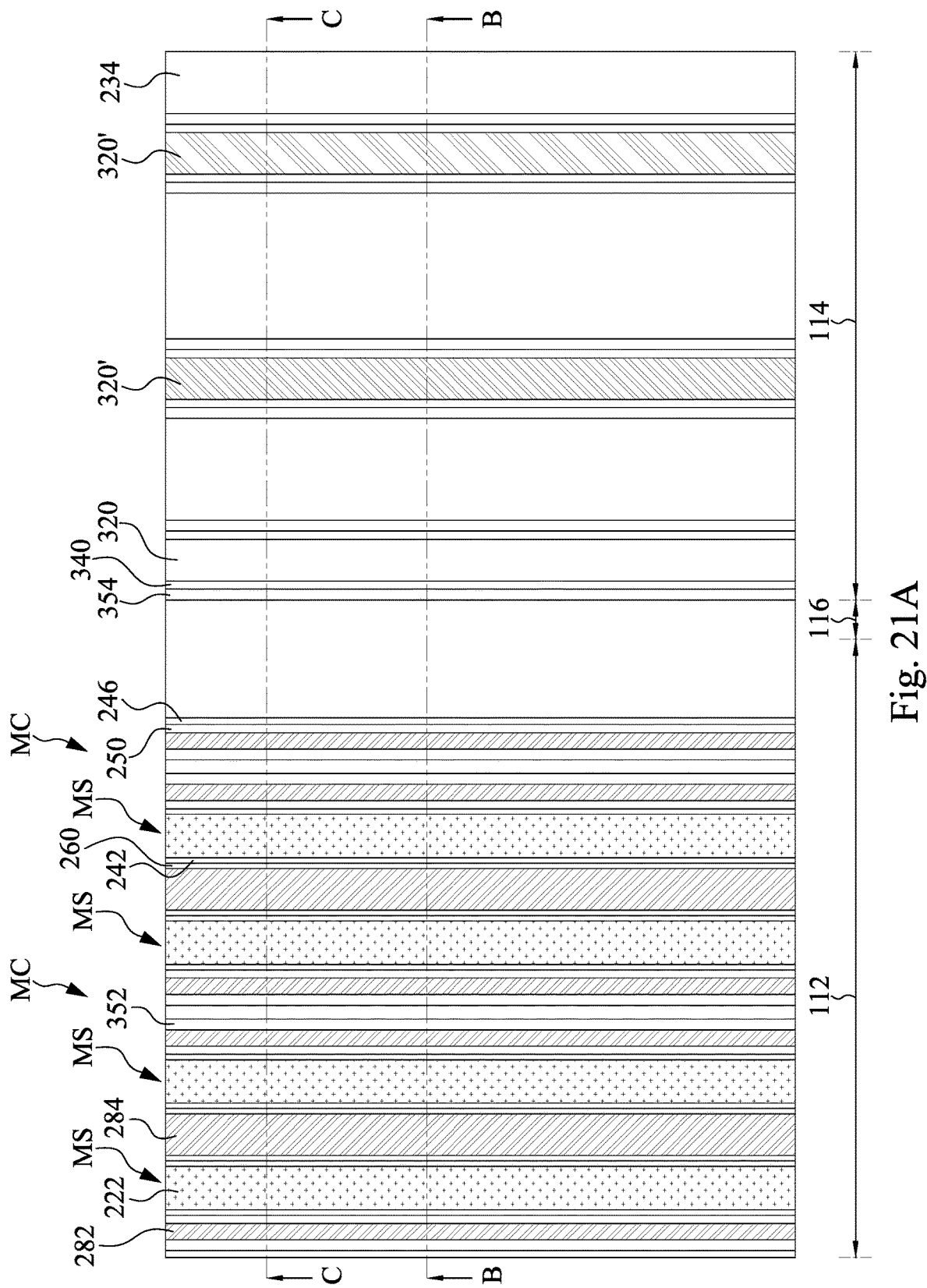
Figure 21B:
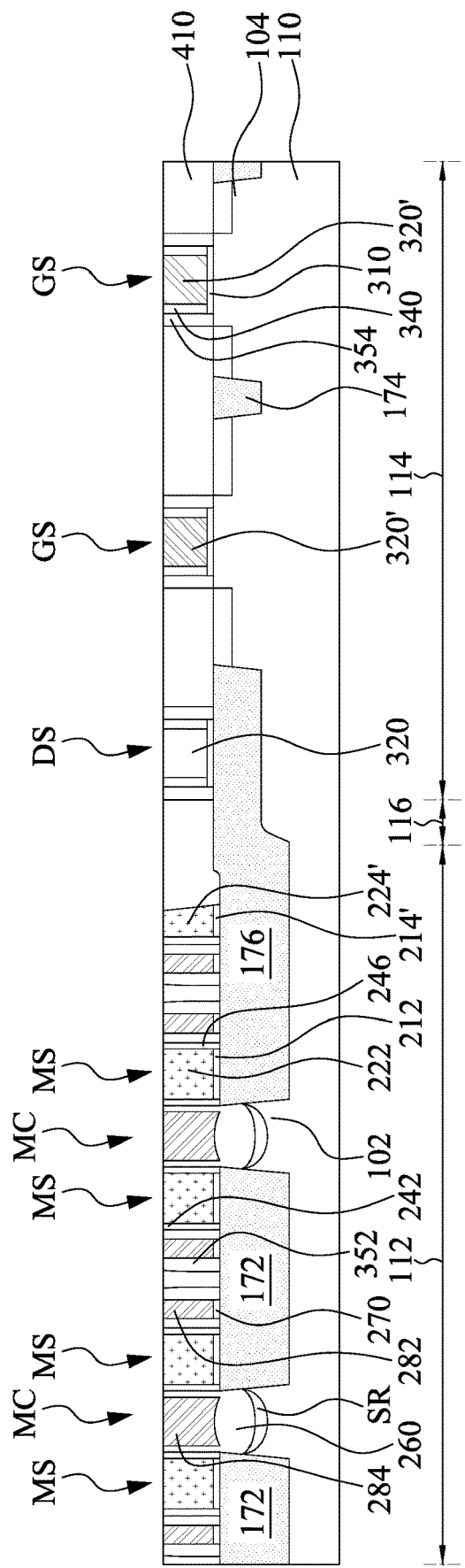
Figure 21C:
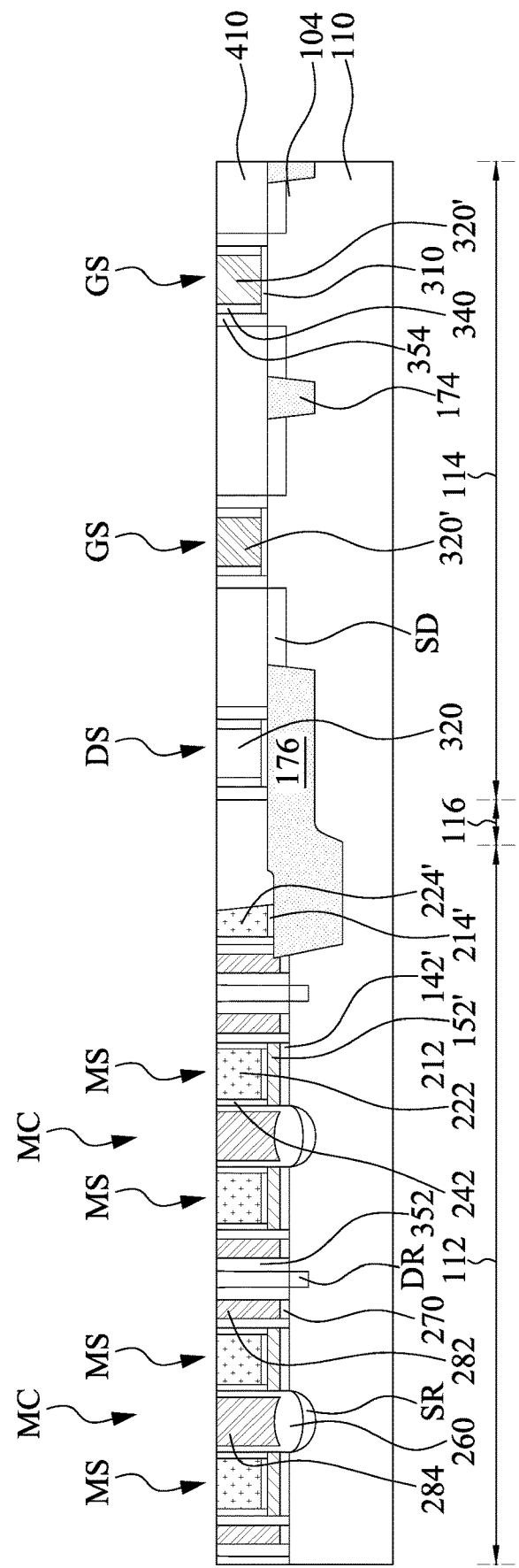
Figure 21D:
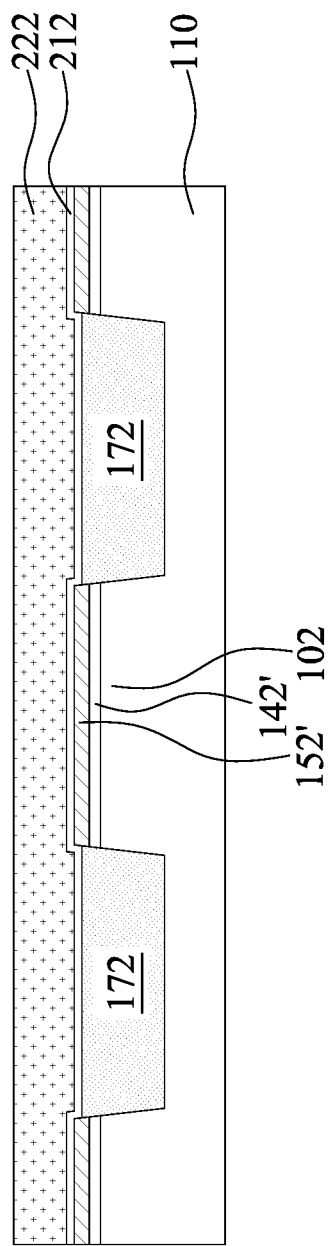

Reference is made to FIGS. 21A to 21D, where FIG. 21A is a top view of the IC, FIG. 21B is a cross-sectional view taken along line B-B of FIG. 21A, FIG. 21C is a cross-sectional view taken along line C-C of FIG. 21A, and FIG. 21D is a cross-sectional view taken along line D-D of FIG. 21A. An interlayer dielectric (ILD) layer 410 is formed over the structure of FIGS. 20A and 20B. Then, a chemical mechanical polish (CMP) process is performed to level the top surface of the ILD layer 410 with the top surfaces of the erase gates 284, the control gates 222, and the select gates 282 and a top surface of the gate electrode 320 of the stacks DS and GS (referring to FIGS. 20A and 20B). In some embodiments, after the CMP process, a gate replacement process is performed to replace the gate electrodes 320 of the gate stacks GS (referring to FIGS. 20A and 20B) with metal gate electrodes 320'. To be specific, the gate electrodes 320 of the gate stacks GS (referring to FIGS. 20A and 20B) are removed to leave gate trenches between the gate spacers 340/354, and conductive metal materials fills the gate trenches, thereby forming the metal gate electrodes 320'. As such, a plurality of memory cells MC are formed. At least one of the memory cells MC includes two memory stacks MS, one erase gate 284, two select gates 282, one source region SR, and two drain regions DR. Two adjacent memory cells MC share one drain region DR. In some embodiments, prior to the formation of the ILD layer 410, an etching stop layer is conformally formed over the structure of FIGS. 20A and 20B.

Figure 22:
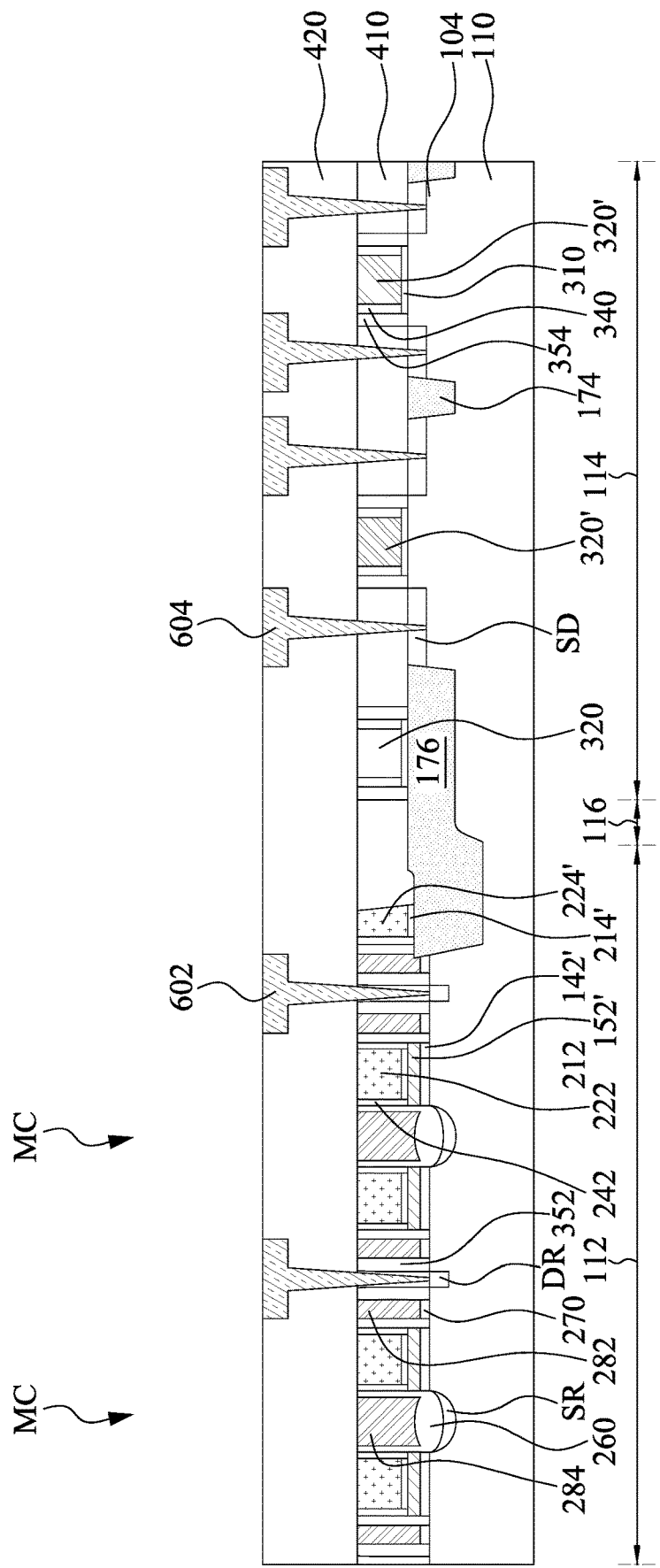

Reference is made to FIG. 22, where the cross-sectional positions of FIG. 22 is the same as the cross-sectional position of FIG. 21C. One or plural ILD layers 420 are formed over the structure of FIG. 21C, and then a metallization pattern is formed in the ILD layers 410 and 420 to connect the drain regions DR and the source/drain regions SD, thereby forming an integrated circuit. The metallization pattern may include a plurality of metal lines, drain contacts 602 connecting the drain regions DR, and source/drain contacts 604 connecting the source/drain regions SD. Specifically, the ILD layer 420 and 410 are etched to form trenches and holes to expose the drain regions DR and the source/drain regions SD, then a metal material may fill the trenches and holes, and an excess portion of the metal material outside the trenches and holes are removed by suitable planarization process (e.g., CMP process), thereby forming metal lines, the drain contacts 602, and source/drain contacts 604.

In the embodiments, the floating gates 152' of the memory cells MC are formed without being planarized, such that the floating gates 152' are prevented from dishing and erosion issue caused by the planarization process, which in turn will prevent floating gates 152' in array center from being over-polished, and thereby improving the thickness uniformity of the floating gates 152' in the array center and array edge. That is, the floating gates 152' of the memory cells MC in the center and edges of the cell regions 112 have substantially the same thickness. In some embodiments, the tunneling layers 142' are formed by oxidation and therefore have a uniform thickness. That is, the tunneling layers 142' have substantially the same thickness. Through the configuration, the memory cells MC may have substantially the same electrical characteristics, which results in high yield rate. The term "substantially" as used herein may be applied to modify any quantitative representation which could permissibly vary without resulting in a change in the basic function to which it is related. It is noted that the number of the memory cells MC in the figures is illustrative, and should not limit the present disclosure. In some other embodiments, the number of the memory cells MC can be greater than two and arranged as an array.

Figure 23A:
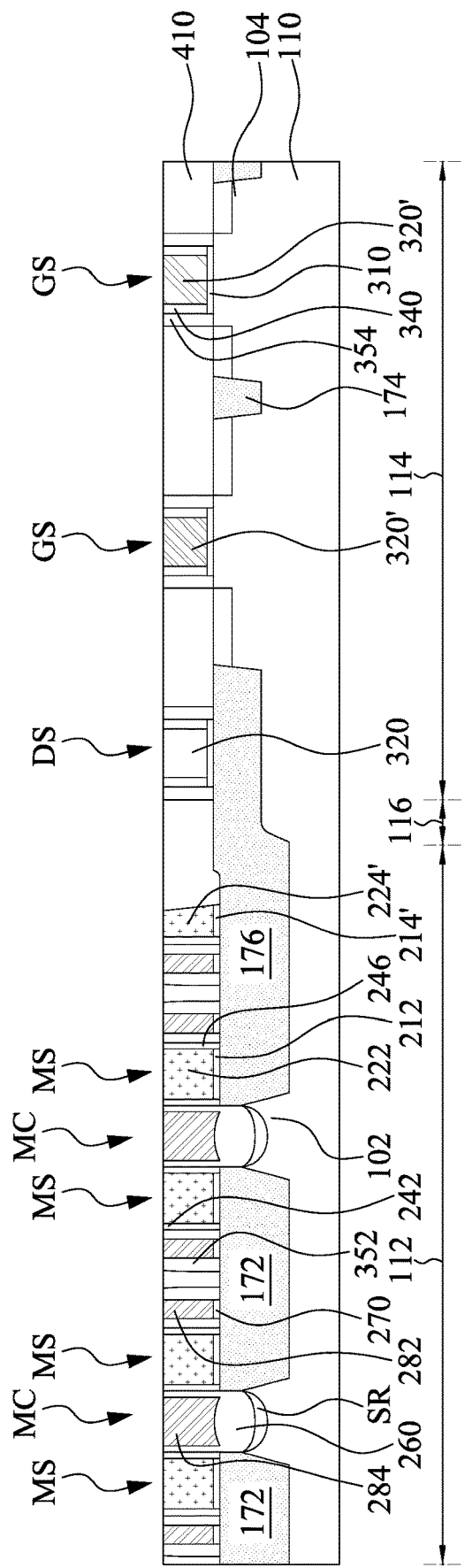
FIG. 23A to 23C are cross-sectional views of a semiconductor device including an integrated circuit in accordance with some embodiments.
Figure 23B:
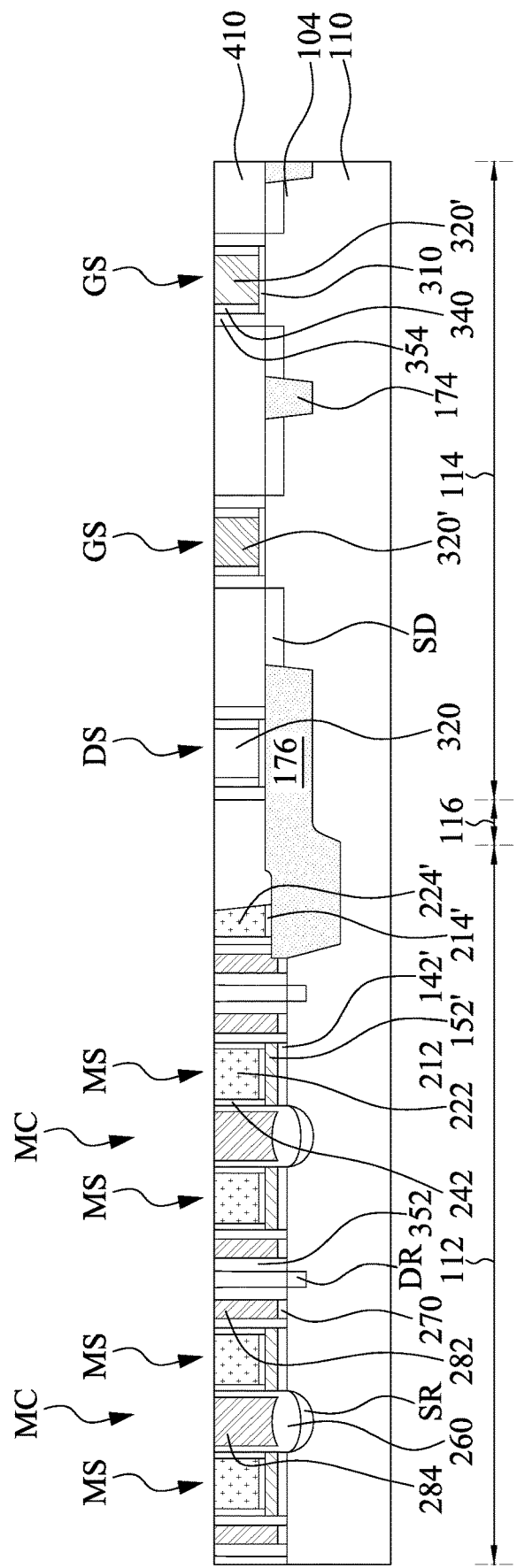
Figure 23C:
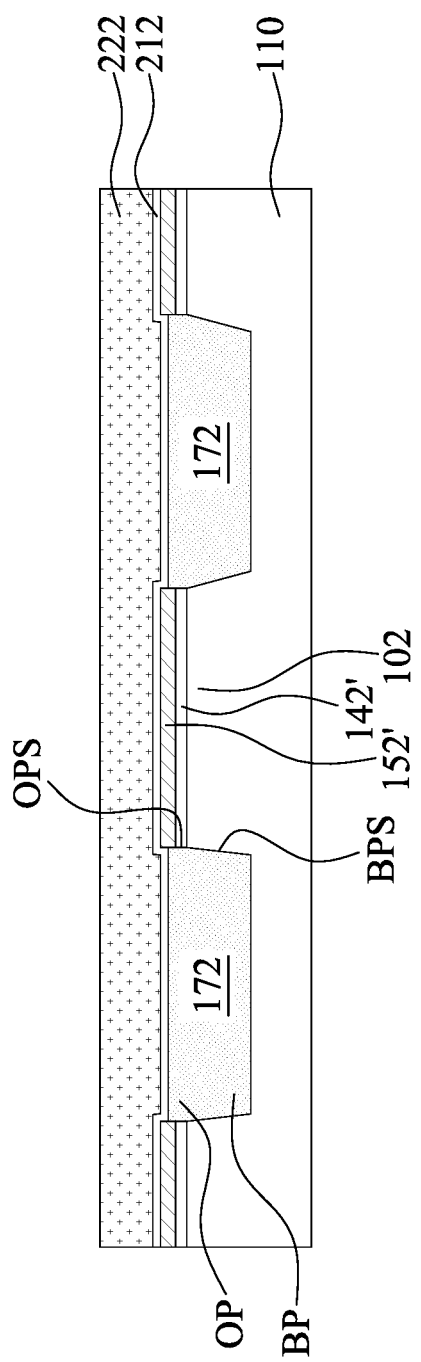

Reference is made to FIGS. 23A to 23C, where the cross-sectional positions of FIGS. 23A to 23C are respectively the same as the cross-sectional position of FIGS. 21B to 21D. The difference between the semiconductor device of FIGS. 23A to 23C and the semiconductor device of FIGS. 21B to 21D pertains to the profile of the isolation feature 172, 174, and 176, and the corresponding profile of the floating gates 152', the tunneling layers 142' and the base portion 102 of the substrate 110. In some embodiments, since the etch process shown in FIGS. 5A-5D may have different etch property to the floating gate layer 150, and the substrate 110 (referring to FIG. 4), each of the isolation feature 172 has a bottom portion BP and an upper portion OP over the bottom portion, and sidewalls BPS of the bottom portion BP inclines more than sidewalls OPS of the upper portion OP. In other words, an angle between one of the sidewalls BPS and a top surface of the substrate 110 may be less than an angle between one of the sidewalls OPS and a top surface of the substrate 110. For example, the upper portions OP of the isolation features 172 have substantially vertical sidewalls OPS adjoining the floating gates 152' and the tunneling layers 142', and the bottom portions BP of the isolation features 172 has inclined sidewalls BPS adjoining the base portion 102 of the substrate 110. In some embodiments, the bottom portions BP of the isolation features 172 taper downward. In some embodiments, the bottom portions BP of the isolation feature 172 may be rounded.

As aforementioned, the floating gates 152' and the tunneling layers 146 are aligned with respect to the underlying active region of the substrate 110 (i.e., the base portions 102 of the substrate 110). For example, the sidewalls of the floating gates 152', the tunneling layers 146, and the base portions 102 of the substrate 110 are aligned with each other. Other relevant structural details of the semiconductor device of FIGS. 23A to 23C are similar to the semiconductor device of FIGS. 21A to 21D, and, therefore, a description in this regard will not be repeated hereinafter.

The present disclosure is applicable to fabrication of an embedded flash memory. Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the floating gates are formed without being planarized, such that the floating gates are prevented from dishing and erosion issue caused by the planarization process, which in turn will prevent floating gates in array center from being over-polished, and thereby improving the thickness uniformity of the floating gates in the array center and array edge and increasing yield rate. Another advantage is that the removal of the hard mask in cell region and the recessing of the isolation features in cell region may be performed using the same photomask, thereby saving the number of masks.

According to some embodiments, a method for manufacturing a semiconductor device is provided. The method includes depositing a floating gate film over a substrate; forming a control gate over a first portion of the floating gate film over a cell region of the substrate; patterning the first portion of the floating gate film into at least one floating gate; removing a second portion of the floating gate film over a peripheral region of the substrate after patterning the first portion of the floating gate film; and forming a gate stack over the peripheral region of the substrate.

According to some embodiments, a method for manufacturing a semiconductor device is provided. The method includes depositing a floating gate film over a substrate; forming a plurality of first isolation features and a plurality of second isolation features in the floating gate film and the substrate, wherein the first isolation features surrounds a first region of the substrate and the second isolation features surrounds a second region of the substrate; forming a control gate above the floating gate film and the first region of the substrate; patterning the floating gate film into at least one floating gate over the first region of the substrate; and forming a gate stack over the second region of the substrate.

According to some embodiments, a semiconductor device includes a substrate, an isolation feature, a floating gate, and a control gate. The substrate has a protruding portion. The isolation feature surrounds the protruding portion of the substrate. The floating gate is over the protruding portion of the substrate, in which a sidewall of the floating gate is aligned with a sidewall of the protruding portion of the substrate. The control gate is over the floating gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
   depositing a floating gate film over a substrate;
   forming a control gate over a first portion of the floating gate film over a cell region of the substrate;
   patterning the first portion of the floating gate film into at least one floating gate;
   removing a second portion of the floating gate film over a peripheral region of the substrate after patterning the first portion of the floating gate film; and
   forming a gate stack over the peripheral region of the substrate.

2. The method of claim 1, further comprising:
   recessing the cell region of the substrate prior to depositing the floating gate film.

3. The method of claim 1, further comprising:
   forming a first isolation feature in the first portion of the floating gate film and the cell region of the substrate prior to patterning the first portion of the floating gate film.

4. The method of claim 3, wherein forming the first isolation feature comprises:
   etching a first trench in the first portion of the floating gate film and the cell region of the substrate; and
   filling the first trench with a dielectric material.

5. The method of claim 1, further comprising:
   forming a second isolation feature in the second portion of the floating gate film and the peripheral region of the substrate prior to patterning the first portion of the floating gate film.

6. The method of claim 5, wherein forming the second isolation feature comprises:
   etching a second trench in the second portion of the floating gate film and the peripheral region of the substrate; and
   filling the second trench with a dielectric material.

7. The method of claim 1, further comprising:
   forming a mask layer covering the second portion of the floating gate film and exposing the first portion of the floating gate film prior to patterning the first portion of the floating gate film; and
   removing the mask layer after patterning the first portion of the floating gate film and prior to removing the second portion of the floating gate film.

8. The method of claim 1, further comprising:
   forming a protective layer over the control gate and the floating gate prior to removing the second portion of the floating gate film; and
   removing the protective layer after removing the second portion of the floating gate film.

9. A method for manufacturing a semiconductor device, the method comprising:
   depositing a floating gate film over a substrate;

forming a plurality of first isolation features and a plurality of second isolation features in the floating gate film and the substrate, wherein the first isolation features surrounds a first region of the substrate and the second isolation features surrounds a second region of the substrate;

forming a control gate above the floating gate film and the first region of the substrate;

patterning the floating gate film into at least one floating gate over the first region of the substrate; and forming a gate stack over the second region of the substrate.

10. The method of claim 9, further comprising:
removing a portion of the floating gate film over the second region of the substrate prior to forming the gate stack.

11. The method of claim 10, wherein removing the portion of the floating gate film over the second region of the substrate is performed after patterning the floating gate film.

12. The method of claim 9, wherein forming the first isolation features and the second isolation features comprises:
depositing a mask layer over the floating gate film;
etching a plurality of trenches in the mask layer, the floating gate film, and the substrate; and
filling the trenches with a dielectric material.

13. The method of claim 12, wherein forming the first isolation features and the second isolation features further comprises:
planarizing the dielectric material until reaching the mask layer.

14. The method of claim 12, further comprising:
removing a first portion of the mask layer over the first region of the substrate prior to patterning the floating gate film.

15. The method of claim 12, further comprising:
removing a second portion of the mask layer over the second region of the substrate after patterning the floating gate film.

16. The method of claim 9, wherein forming the control gate is performed such that the control gate is directly above the first isolation features, and the second isolation features are not directly below the control gate.

17. The method of claim 9, wherein forming the first isolation features and the second isolation features are performed such that a bottom of the second isolation features is higher than a bottom of the first isolation features.

18. A method for manufacturing a semiconductor device, the method comprising:
depositing a floating gate film over a cell region and a peripheral region of a substrate;
depositing a mask layer over the floating gate film;
forming a plurality of first isolation features and a plurality of second isolation features in the floating gate film and the mask layer, wherein the first and second isolation features are respectively over the cell region and the peripheral region of the substrate;
removing a first portion of the mask layer over the cell region to expose a first portion of the floating gate film over the cell region;
forming a control gate above the first portion of the floating gate film;
removing a second portion of the mask layer and a second portion of the floating gate film over the peripheral region of the substrate after forming the control gate; and
forming a gate stack over the peripheral region of the substrate.

19. The method of claim 18, further comprising:
recessing a top surface of the cell region of the substrate prior to depositing the floating gate film, wherein the recessed top surface of the cell region of the substrate is lower than a top surface of the peripheral region of the substrate.

20. The method of claim 18, further comprising:
recessing top surfaces of the first isolation features prior to forming the control gate.

* * * * *